United States Patent
Zhou et al.

(10) Patent No.: US 12,274,136 B2
(45) Date of Patent: Apr. 8, 2025

(54) ORGANIC LIGHT EMITTING DIODE DISPLAY SUBSTRATE AND PREPARING METHOD THEREOF, AND ORGANIC LIGHT EMITTING DIODE DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Hongjun Zhou, Beijing (CN); Lili Du, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 461 days.

(21) Appl. No.: 17/425,949

(22) PCT Filed: Oct. 22, 2020

(86) PCT No.: PCT/CN2020/122895
§ 371 (c)(1),
(2) Date: Jul. 27, 2021

(87) PCT Pub. No.: WO2022/082631
PCT Pub. Date: Apr. 28, 2022

(65) Prior Publication Data
US 2022/0320241 A1 Oct. 6, 2022

(51) Int. Cl.
*H10K 59/131* (2023.01)
*G01R 31/28* (2006.01)
(Continued)

(52) U.S. Cl.
CPC ....... *H10K 59/131* (2023.02); *G01R 31/2884* (2013.01); *H10K 71/00* (2023.02);
(Continued)

(58) Field of Classification Search
CPC .. H10K 59/131; H10K 71/70; H10K 59/1201; H10K 59/351; H10K 59/124; G09G 3/006
See application file for complete search history.

(56) References Cited

U.S. PATENT DOCUMENTS 9,147,723 B1 * 9/2015 Lee ...................... G09G 3/3241
9,735,119 B1    8/2017 Lee
(Continued)

FOREIGN PATENT DOCUMENTS

CN          1722452 A     1/2006
CN        101236310 A     8/2008
(Continued)

*Primary Examiner* — Daniel Whalen
*Assistant Examiner* — Seyon Ali-Simah Punchbeddell
(74) *Attorney, Agent, or Firm* — Ling Wu; Stephen Yang; Ling and Yang Intellectual Property

(57) ABSTRACT

A display substrate and a preparing method thereof, and a display apparatus are provided. The display substrate includes a display region and a peripheral region, wherein the peripheral region includes a circuit board pin region and a test pin region which are located on at least one side of the display region. The display substrate further includes: a plurality of sub-pixels, and a first power supply line electrically connected with the plurality of sub-pixels; at least one first bonding power supply pin, located in the circuit board pin region, electrically connected with the first power supply line, and configured to transmit a first power supply signal to the plurality of sub-pixels in a display stage; a second power supply line, located in the peripheral region and surrounding the display region.

15 Claims, 9 Drawing Sheets

(51) Int. Cl.
  *H01L 23/00* (2006.01)
  *H10K 71/00* (2023.01)
  *H10K 59/12* (2023.01)
(52) U.S. Cl.
  CPC .... *H01L 24/06* (2013.01); *H01L 2224/06155* (2013.01); *H10K 59/1201* (2023.02)

(56) References Cited

U.S. PATENT DOCUMENTS

| | | | | |
|---|---|---|---|---|
| 2006/0001792 | A1* | 1/2006 | Choi | H10K 59/88 |
| | | | | 257/E27.111 |
| 2016/0284771 | A1* | 9/2016 | Hwang | H10K 59/1213 |
| 2018/0076102 | A1* | 3/2018 | Ka | H01L 27/1251 |
| 2018/0166525 | A1 | 6/2018 | Kim et al. | |
| 2021/0036087 | A1* | 2/2021 | Kwak | G09G 3/006 |
| 2021/0091162 | A1* | 3/2021 | Kim | H10K 59/131 |

FOREIGN PATENT DOCUMENTS

| | | |
|---|---|---|
| CN | 204556665 U | 8/2015 |
| CN | 107658232 A | 2/2018 |
| CN | 108549181 A | 9/2018 |
| CN | 108648672 A | 10/2018 |
| CN | 109872667 A | 6/2019 |
| CN | 209201384 U | 8/2019 |
| KR | 10-2019-0097761 A | 8/2019 |

\* cited by examiner

ORGANIC LIGHT EMITTING DIODE DISPLAY SUBSTRATE AND PREPARING METHOD THEREOF, AND ORGANIC LIGHT EMITTING DIODE DISPLAY APPARATUS

TECHNICAL FIELD

The present disclosure relates to, but is not limited to, the field of display technology, in particular to a display substrate and a preparation method thereof, and a display apparatus.

BACKGROUND

An Organic Light Emitting Diode (OLED) is an active light emitting display device, and has advantages of self-emission, wide view angle, high contrast, low power consumption, extremely high response speed, etc. With continuous development of the display technology, a flexible display apparatus with OLEDs as light-emitting devices and Thin Film Transistors (TFTs) for performing signal controlling has become a mainstream product in the current display field.

SUMMARY

The following is a summary of subject matter described in detail herein. This summary is not intended to limit the protection scope of the claims.

Embodiments of the present disclosure provide a display substrate, including a display region and a peripheral region surrounding the display region, wherein the peripheral region includes a circuit board pin region and a test pin region located on at least one side of the display region; the display substrate includes: a plurality of sub-pixels located in the display region; a first power supply line, located in the display region, and electrically connected with the plurality of sub-pixels; at least one first bonding power supply pin, located in the circuit board pin region, electrically connected with the first power supply line, and configured to transmit a first power supply signal to the plurality of sub-pixels in a display stage; a second power supply line, located in the peripheral region and surrounding the display region; at least one second bonding power supply pin, located in the circuit board pin region, electrically connected with the second power supply line, and configured to transmit a second power supply signal to the plurality of sub-pixels in the display stage; and at least one test power supply pin, located in the test pin region, and electrically connected to at least one of the first power supply line and the second power supply line, the at least one test power supply pin being configured to transmit at least one of the first power supply signal and the second power supply signal to the plurality of sub-pixels in a test stage.

In some exemplary embodiments, the at least one test power supply pin includes a first test power supply pin and a second test power supply pin, wherein the first test power supply pin electrically is connected with the first power supply line, and the second test power supply pin electrically is connected with the second power supply line.

In some exemplary embodiments, the second test power supply pin is located on one side of the first test power supply pin close to the display region.

In some exemplary embodiments, the display substrate further includes a first bonding power lead and a second bonding power lead, wherein the first bonding power lead is electrically connected with the first power supply line and the first bonding power supply pin, and the second bonding power lead is electrically connected with the second power supply line and the second bonding power supply pin; the display substrate further includes a first connecting line and a second connecting line, wherein the first test power supply pin is electrically connected with the first bonding power lead through the first connecting line, and the second test power supply pin is electrically connected with the second bonding power lead through the second connecting line.

In some exemplary embodiments, the display substrate further includes a first test power lead and a second test power lead, the first test power lead extends along a first direction, the second test power lead extends along the first direction, the first connecting line extends along a second direction, the second connecting line extends along the second direction, the first test power lead is electrically connected with the first connecting line and the first test power supply pin, and the second test power lead is electrically connected with the second connecting line and the second test power supply pin.

In some exemplary embodiments, in a plane perpendicular to the display substrate, the display substrate includes a substrate, and a first insulating layer, an active layer, a second insulating layer, a first gate metal layer, a third insulating layer, a second gate metal layer, a fourth insulating layer, and a first source-drain metal layer which are stacked on the substrate; at least part of the first connecting line is disposed on a same layer as at least one of the first gate metal layer, the second gate metal layer, or the first source-drain metal layer.

In some exemplary embodiments, in a plane perpendicular to the display substrate, the display substrate includes a substrate, and a first insulating layer, an active layer, a second insulating layer, a first gate metal layer, a third insulating layer, a second gate metal layer, a fourth insulating layer, and a first source-drain metal layer which are stacked on the substrate; the first connecting line includes a first sub-connecting line and a second sub-connecting line, wherein the first sub-connecting line is disposed in a same layer as the first gate metal layer, and the second sub-connecting line is disposed in a same layer as the second gate metal layer, and the first sub-connecting line and the second sub-connecting line are connected in parallel and electrically, the first sub-connecting line is at least partially overlapped with the first bonding power lead and the second bonding power lead, and the second sub-connecting line is at least partially overlapped with the first bonding power lead and the second bonding power lead; or, the first connecting line includes a first sub-connecting line and a third sub-connecting line, the first sub-connecting line is electrically connected with the third sub-connecting line, and the first sub-connecting line is at least partially overlapped with the first bonding power lead and the second bonding power lead, the third sub-connecting line is not overlapped with the first bonding power lead or the second bonding power lead, the first sub-connecting line is disposed on a same layer as the first gate metal layer, and the third sub-connecting line is disposed on a same layer as the first source-drain metal layer.

In some exemplary embodiments, the first test power supply pin includes a first sub-layer and a second sub-layer, wherein the first sub-layer and the second sub-layer are electrically connected.

In some exemplary embodiments, the second test power supply pin includes a third sub-layer and a fourth sub-layer, wherein the third sub-layer and the fourth sub-layer are electrically connected.

In some exemplary embodiments, in a plane perpendicular to the display substrate, the display substrate includes a substrate, and a first insulating layer, an active layer, a second insulating layer, a first gate metal layer, a third insulating layer, a second gate metal layer, a fourth insulating layer, and a first source-drain metal layer which are stacked on the substrate; the first sub-layer and the third sub-layer are disposed in a same layer as the first source-drain metal layer, and the second sub-layer and the fourth sub-layer are disposed in a same layer as the first gate metal layer.

In some exemplary embodiments, the first bonding power supply pin includes a first sub-pin and a second sub-pin, and the second bonding power supply pin includes a third sub-pin and a fourth sub-pin, wherein the third sub-pin is located on one side of the first sub-pin away from the second sub-pin, and the fourth sub-pin is located on one side of the second sub-pin away from the first sub-pin.

In some exemplary embodiments, the test power supply pins include a first test power supply pin and a second test power supply pin, wherein the first test power supply pin includes a fifth sub-pin and a sixth sub-pin, the second test power supply pin includes a seventh sub-pin and an eighth sub-pin, the seventh sub-pin is located on one side of the fifth sub-pin away from the circuit board pin region, and the eighth sub-pin is located on one side of the sixth sub-pin away from the circuit board pin region.

In some exemplary embodiments, the display substrate further includes a first power bus, wherein the first power bus is located on one side of the display region close to the circuit board pin region, and the first power bus is electrically connected with the first bonding power supply pin and the first power supply line.

In some exemplary embodiments, the display substrate further includes a plurality of test units, at least one test data signal line, and at least one test control signal line, wherein at least one of the plurality of test units is electrically connected with at least one of the plurality of data lines, the at least one test data signal line, and the at least one test control signal line, and is configured to deliver, according to a signal transmitted by the at least one test control signal line, a signal transmitted by the at least one test data signal line to the at least one data line.

In some exemplary embodiments, the test pin region further includes at least one first test pin and at least one second test pin, wherein the first test pin is located on one side of the seventh sub-pin away from the circuit board pin region, and the second test pin is located on one side of the eighth sub-pin away from the circuit board pin region.

In some exemplary embodiments, the substrate is a rigid substrate or a flexible substrate.

An embodiment of the present disclosure further provides a display apparatus, including the display substrate as described in any one of the above.

An embodiment of the present disclosure further provides a method for preparing a display substrate, wherein the display substrate includes a display region and a peripheral region surrounding the display region, the peripheral region includes a circuit board pin region and a test pin region located on one side of the display region, the display region includes a first power supply line and a plurality of sub-pixels, the peripheral region includes a second power supply line, the circuit board pin region includes at least one first bonding power supply pin and at least one second bonding power supply pin, the test pin region includes at least one test power supply pin, and the preparing method includes: sequentially forming a first insulating layer, an active layer, a second insulating layer, a first gate metal layer, a third insulating layer, and a second gate metal layer on a substrate; forming a fourth insulating layer on the second gate metal layer; forming a first source-drain metal layer, the first power supply line, the second power supply line, the first bonding power supply pin, the second bonding power supply pin, and at least one of the test power supply pin on the fourth insulating layer; the first power supply line is electrically connected with the first bonding power supply pin, the second power supply line is electrically connected with the second bonding power supply pin, and the at least one test power supply pin is electrically connected with at least one of the first power supply line and the second power supply line.

In some exemplary embodiments, at least one of the test power supply pin includes a first test power supply pin and a second test power supply pin, wherein the first test power supply pin is electrically connected with the first power supply line, and the second test power supply pin is electrically connected with the second power supply line.

In some exemplary embodiments, a first connecting line is formed on the second insulating layer or the third insulating layer, and the first connecting line is disposed on a same layer as the first gate metal layer or the second gate metal layer; a first test power lead and a second test power lead are formed on the fourth insulating layer, wherein the first test power lead and the second test power lead are disposed on a same layer as the first source-drain metal layer, the first test power lead is electrically connected with the first connecting line and the first test power supply pin, the first test power supply pin is electrically connected with the first bonding power lead through the first connecting line, and the second test power lead is electrically connected with the second bonding power lead and the second test power supply pin.

Other aspects will be understood after the drawings and the detailed description are read and understood.

BRIEF DESCRIPTION OF DRAWINGS

Accompanying drawings are used to provide a further understanding of technical solutions of the present disclosure and constitute a part of the specification to explain the technical solutions of the present disclosure together with embodiments of the present disclosure, and do not constitute any limitation on the technical solutions of the present disclosure. Shapes and sizes of various components in the drawings do not reflect true scales and are intended to illustrate schematically contents of the present disclosure only.

DETAILED DESCRIPTION

Figure 1:
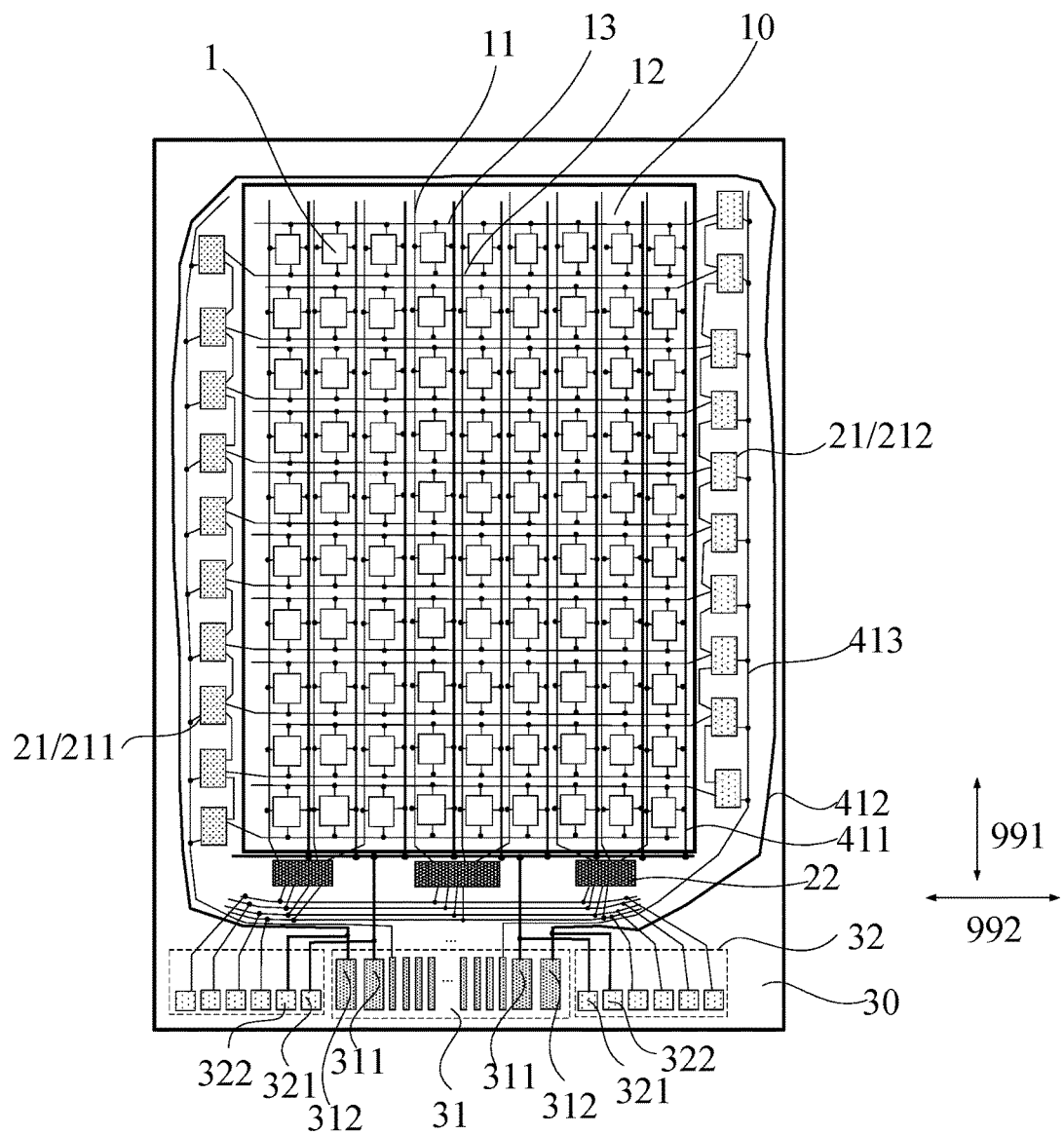
FIG. 1 is a schematic structural diagram of a display substrate according to an exemplary embodiment of the present disclosure.

To make the objects, technical solutions and advantages of the present disclosure more clear, embodiments of the present disclosure will be described in detail below with reference to the drawings. It should be noted that the embodiments may be implemented in many different forms. Those of ordinary skills in the art may readily understand the fact that implementations and contents may be transformed into a variety of forms without departing from the spirit and scope of the present disclosure. Therefore, the present disclosure should not be construed as being limited only to what is described in the following embodiments. The embodiments and features in the embodiments in the present disclosure may be combined randomly if there is no conflict.

In the drawings, sizes of various constituent elements and thicknesses and regions of layers are sometimes exaggerated for clarity. Therefore, an implementation of the present disclosure is not necessarily limited to the sizes shown. The shapes and sizes of various components in the drawings do not reflect true scales. In addition, the drawings schematically show ideal examples, and an implementation of the present disclosure is not limited to the shapes or values shown in the drawings.

The ordinal numbers "first", "second", "third" and the like in this specification are used to avoid confusion between constituent elements, but not to constitute limitations on quantities.

In this specification, for sake of convenience, wordings, such as "central", "upper", "lower", "front", "rear", "vertical", "horizontal", "top", "bottom", "inner", "outer" and the like which are used to indicate orientation or positional relations, to describe the positional relations between constituent elements with reference to the drawings, are only for a purpose of facilitating description of this specification and simplifying the description, rather than indicating or implying that the device or element referred to must have a specific orientation, or must be constructed and operated in a particular orientation, and therefore cannot be construed as limitations on the present disclosure. The positional relations between the constituent elements are appropriately changed according to the directions the constituent element described. Therefore, the wordings are not limited in the specification, and may be replaced appropriately according to situations.

In this specification, terms "install", "connect" and "couple" shall be understood in a broad sense unless otherwise explicitly specified and defined. For example, a connection may be a fixed connection, or a detachable connection, or an integrated connection; it may be a mechanical connection, or an electrical connection; it may be a direct connection, or an indirect connection through middleware, or an internal connection between two elements. For those of ordinary skills in the art, the specific meanings of the above terms in the present disclosure may be understood according to specific situations.

In this specification, a transistor refers to an element including at least three terminals, namely a gate electrode, a drain electrode and a source electrode. The transistor has a channel region between the drain electrode (a drain electrode terminal, a drain region or a drain electrode) and the source electrode (a source electrode terminal, a source region or a source electrode), and current can flow through the drain electrode, the channel region and the source electrode. It should be noted that in this specification, the channel region refers to a region through which current mainly flows.

In this specification, the first electrode may be a drain electrode and the second electrode may be a source electrode, or the first electrode may be a source electrode and the second electrode may be a drain electrode. Functions of the "source electrode" and the "drain electrode" are sometimes interchangeable in a case where transistors with opposite polarities are used or in a case where the current direction changes during circuit operation. Therefore, in this specification, "source electrode" and "drain electrode" are interchangeable.

In this specification, an "electrical connection" includes a case where constituent elements are connected together through an element with a certain electric action. The "element with a certain electric action" is not particularly limited as long as it can transmit and receive electrical signals between the connected constituent elements. Examples of the "element with a certain electric action" include not only electrodes and wirings, but also switching elements such as transistors, resistors, inductors, capacitors, and other elements having various functions.

In this specification, "parallel" refers to a case where an angle formed by two straight lines is above −10° and below 10°, and thus also includes a case where the angle is above −5° and below 5°. In addition, "perpendicular" refers to a case where an angle formed by two straight lines is above −80° and below 100°, and thus also includes a case where the angle is above −85° and below 95°.

In this specification, "film" and "layer" may be interchangeable. For example, sometimes "conductive layer" may be replaced by "conductive film". Similarly, "insulating film" may sometimes be replaced by "insulating layer".

"About" in the present disclose means that limits of a value are not limited strictly, and the value is within a range of process and measurement errors.

Figure 2:
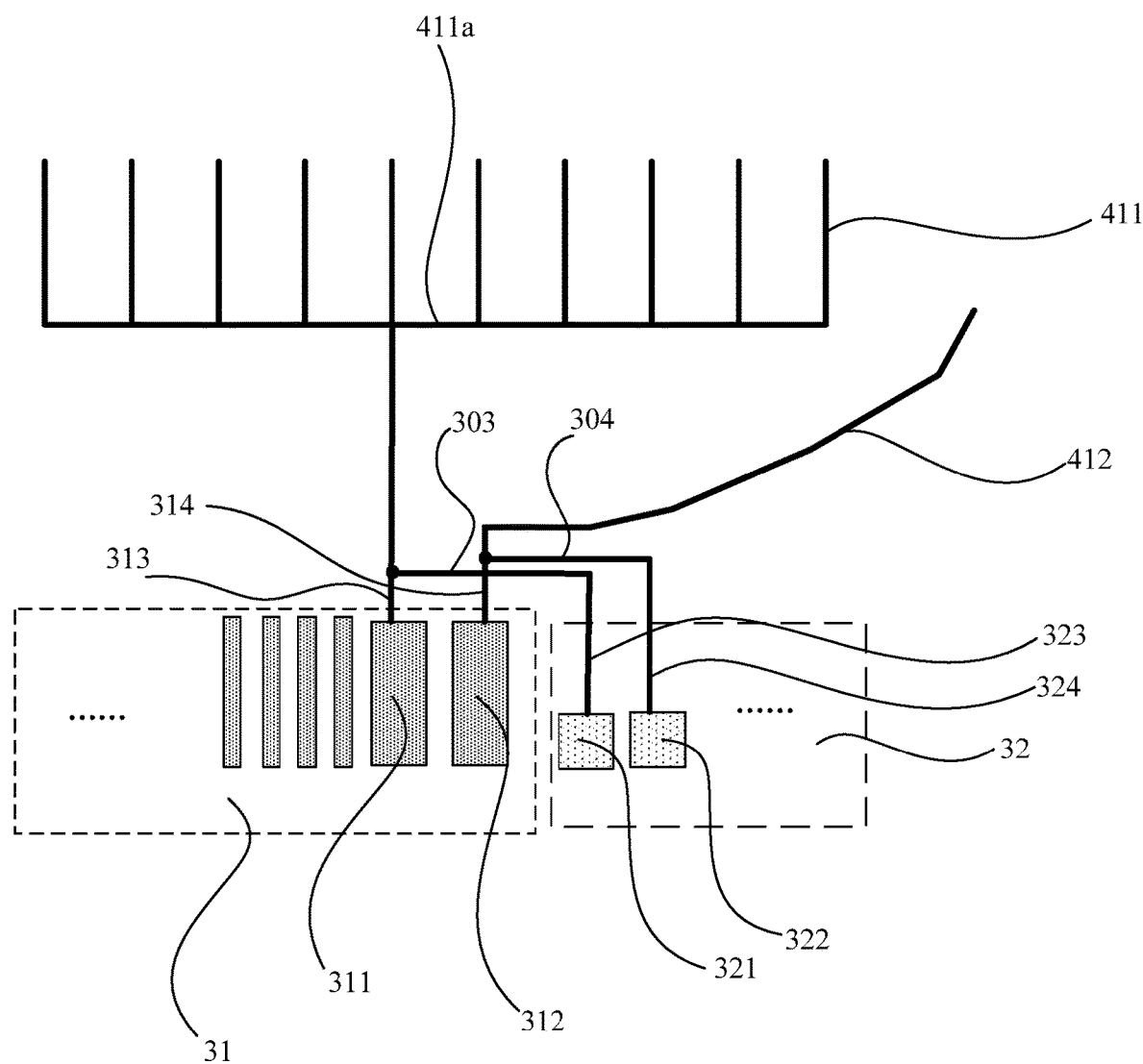
FIG. 2 is a first schematic structural diagram of a peripheral region in a display substrate according to an exemplary embodiment of the present disclosure.

As shown in FIGS. 1 and 2, an exemplary embodiment of the present disclosure provides a display substrate, including a display region 10 and a peripheral region 30 surrounding the display region 10, wherein the peripheral region 30 includes a circuit board pin region 31 and a test pin region 32 located on one side of the display region 10.

The display substrate includes: a plurality of sub-pixels 1 located in the display region 10; a first power supply line 411, located in the display region 10, and electrically connected with the a plurality of sub-pixels 1; at least one first bonding power supply pin 311, located in the circuit board pin region 31, electrically connected with the first power supply line 411, configured to transmit a first power signal to the a plurality of sub-pixels 1 in a display stage; a second power supply line 412, located in the peripheral region 30 and surrounding the display region 10; at least one second bonding power supply pin 312, located in the circuit board pin region 31, electrically connected with the second power supply line 412, and configured to transmit a second power supply signal to the a plurality of sub-pixels 1 in the display stage; and at least one test power supply pin, located in the test pin region 32, electrically connected to at least one of the first power supply line 411 and the second power supply line 412, and configured to transmit at least one of the first power supply signal and the second power supply signal to the a plurality of sub-pixels 1 in a test stage.

The OLED display device needs to perform a Cell Test, after completing backplane circuit fabrication, luminescent material evaporation, and water-proof and oxygen-proof packaging processes, so as to filter out defective products, and prevent the defective products from flowing into a back-end process, thus causing waste of back-end process materials and equipment. According to the display substrate of the embodiment of the present disclosure, by disposing an independent test power supply pin, a problem of scratching, or poor bonding, or the like of a bonding power supply pin in a circuit board pin region caused by sharing the bonding power supply pin in the circuit board pin region due to unit testing is avoided.

In an exemplary embodiment, as shown in FIG. 1 and FIG. 2, at least one test power supply pin includes a first test power supply pin 321 and a second test power supply pin 322, wherein the first test power supply pin 321 electrically connects the first power supply line 411, and the second test power supply pin 322 electrically connects the second power supply line 412.

Figure 6:
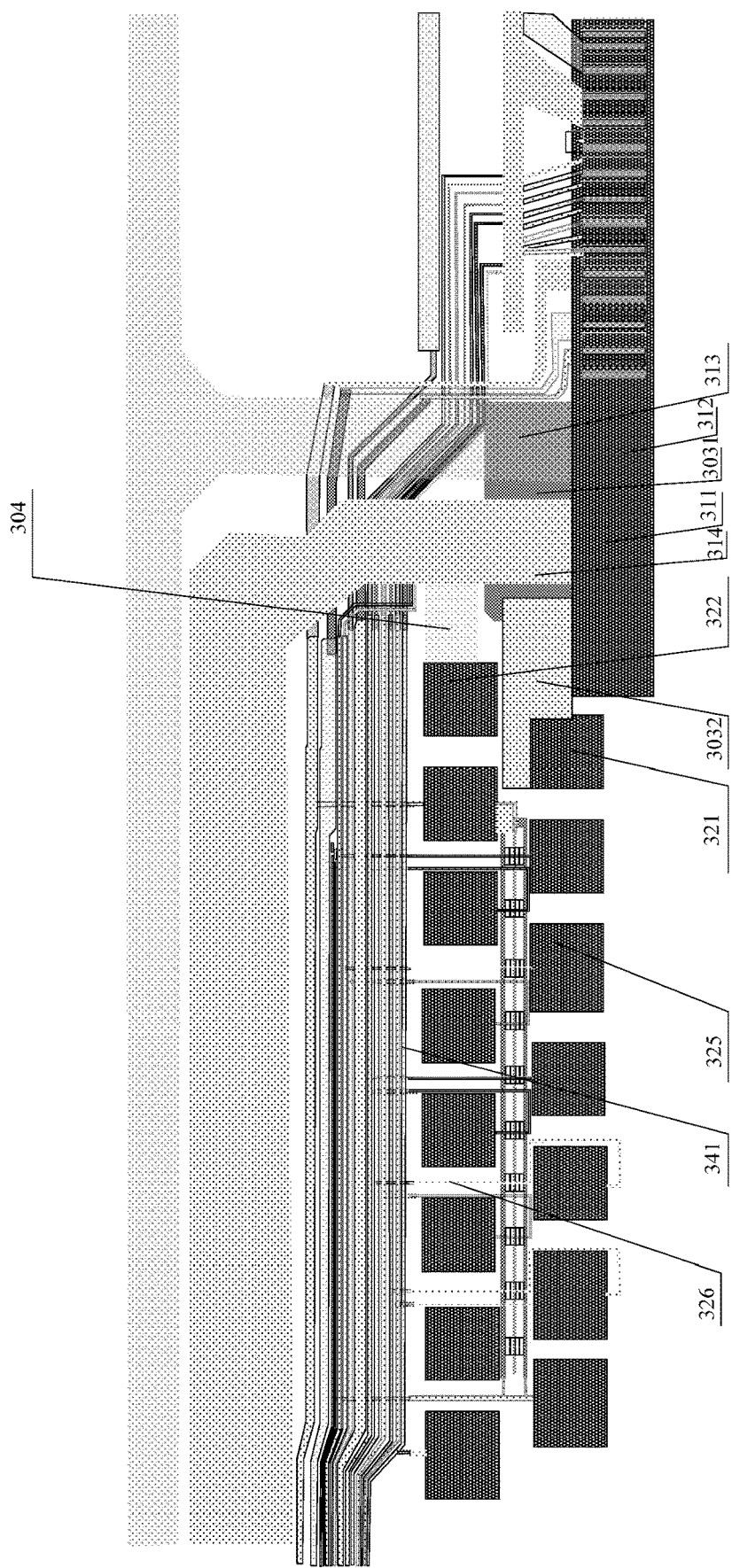
FIG. 6 is a fourth schematic structural diagram of a peripheral region in a display substrate according to an exemplary embodiment of the present disclosure.

In an exemplary embodiment, as shown in FIG. 6, the second test power supply pin 322 is located on one side of the first test power supply pin 321 close to the display region 10.

Figure 3A:
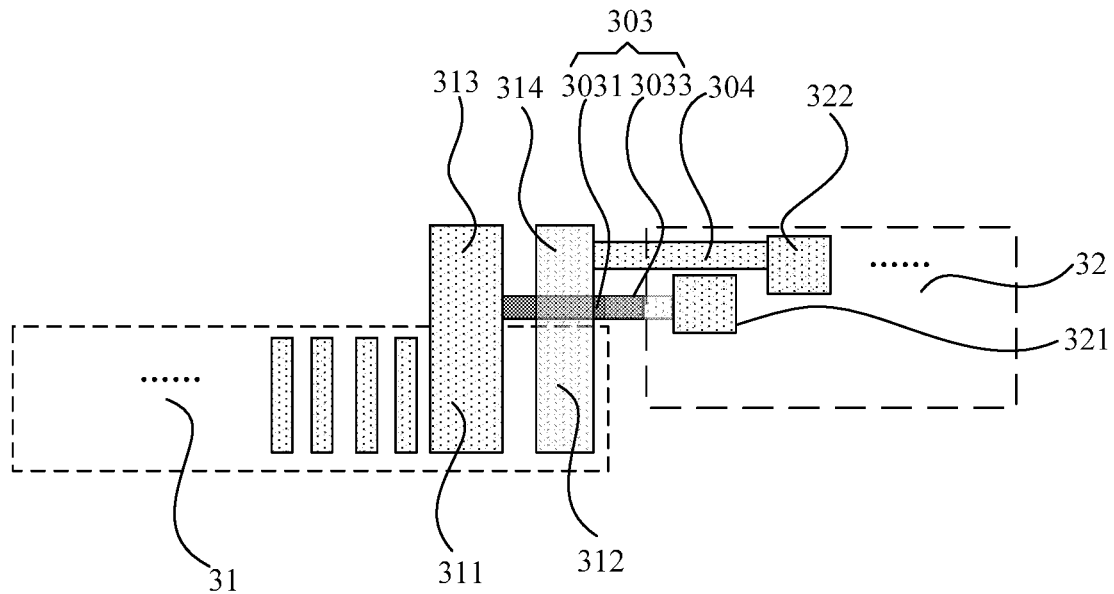
FIG. 3A is a second schematic structural diagram of a peripheral region in a display substrate according to an exemplary embodiment of the present disclosure.

In an exemplary embodiment, as shown in FIG. 3A, the display substrate further includes a first bonding power lead 313 and a second bonding power lead 314, wherein the first bonding power lead 313 electrically connects the first power supply line 411 and the first bonding power supply pin 311, and the second bonding power lead 314 electrically connects the second power supply line 412 and the second bonding power supply pin 312; the display substrate also includes a first connecting line 303 and a second connecting line 304. The first test power supply pin 321 is electrically connected with the first bonding power lead 313 through the first connecting line 303, and the second test power supply pin 322 is electrically connected with the second bonding power lead 314 through the second connecting line 304.

In an exemplary embodiment, as shown in FIG. 2, the display substrate further includes a first power bus 411a, wherein the first power bus 411a is located on one side of the display region 10 close to the circuit board pin region 31, and the first power bus 411a electrically connects the first bonding power supply pin 311 and the first power supply line 411.

Figure 3B:
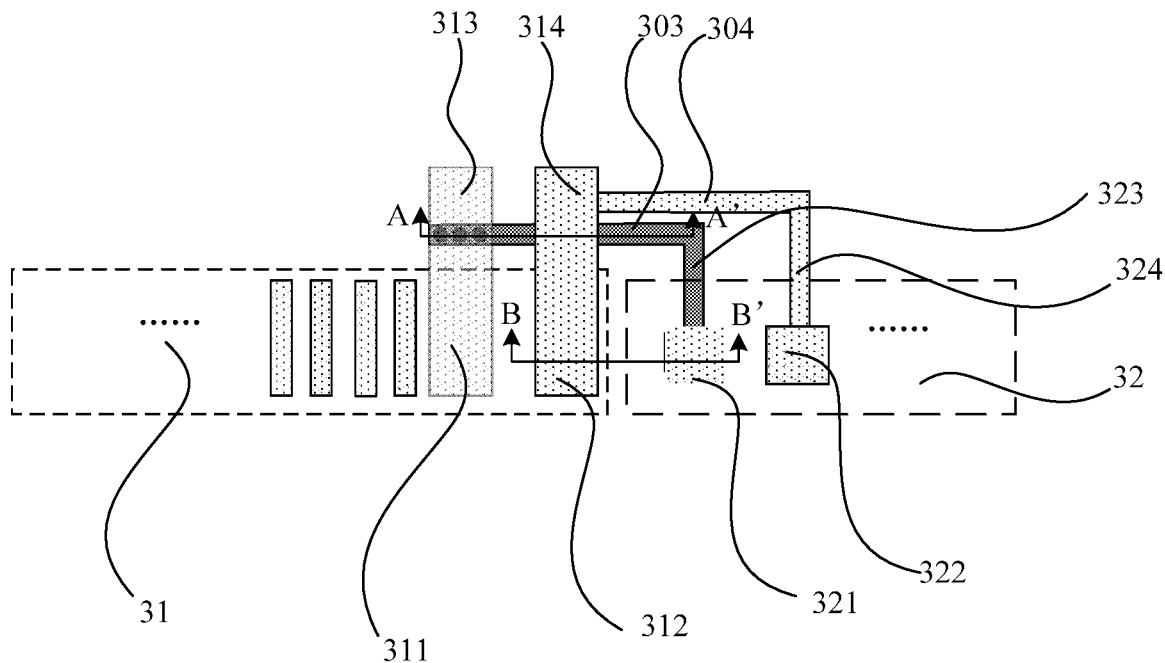
FIG. 3B is a third schematic structural diagram of a peripheral region in a display substrate according to an exemplary embodiment of the present disclosure.

In an exemplary embodiment, as shown in FIG. 2 and FIG. 3B, the display substrate further includes a first test power lead 323 and a second test power lead 324, the first test power lead 323 extends along a first direction 991, the second test power lead 324 extends along a first direction 991, a first connecting line 303 extends along a second direction 992, a second connecting line 304 extends along a second direction 304, the first test power lead 323 is electrically connected with the first connecting line 303 and the first test power supply pin 321, and the second test power lead 324 is electrically connected with the second connecting line 304 and the second test power supply pin 322. The first direction crosses the second direction, and optionally, the first direction is perpendicular to the second direction.

In an exemplary embodiment, as shown in FIG. 2 and FIG. 3B, the circuit board pin region 31 includes a first bonding power lead 313 and a second bonding power lead 314, wherein the first bonding power lead 313 electrically connects the first power supply line 411 and the first bonding power supply pin 311, and the second bonding power lead 314 electrically connects the second power supply line 412 and the second bonding power lead 312; and the test pin region 32 includes a first test power supply pin 321, a second test power supply pin 322, a first test power lead 323 connected with the first test power supply pin 321, and a second test power lead 324 connected with the second test power supply pin 322.

The display substrate further includes a first connecting line 303 and a second connecting line 304, wherein the first connecting line 303 electrically connects the first bonding power lead 313 and the first test power lead 323, and the second connecting line 304 electrically connects the second bonding power lead 314 and the second test power lead 324.

In an exemplary embodiment, as shown in FIG. 1, the display region 10 includes: a plurality of sub-pixels 1; a plurality of data lines 11 extending along the first direction 991, each data line 11 connecting the plurality of sub-pixels 1; and a plurality of gate lines 12 extending along the second direction 992 crossing the first direction 991, each gate line 12 connecting the plurality of sub-pixels 1.

The peripheral region 30 includes a plurality of driving units 21, and a driving signal line 413 connected with the driving units 21, wherein the driving unit 21 is configured to supply a driving signal to the gate line 12.

Figure 11:
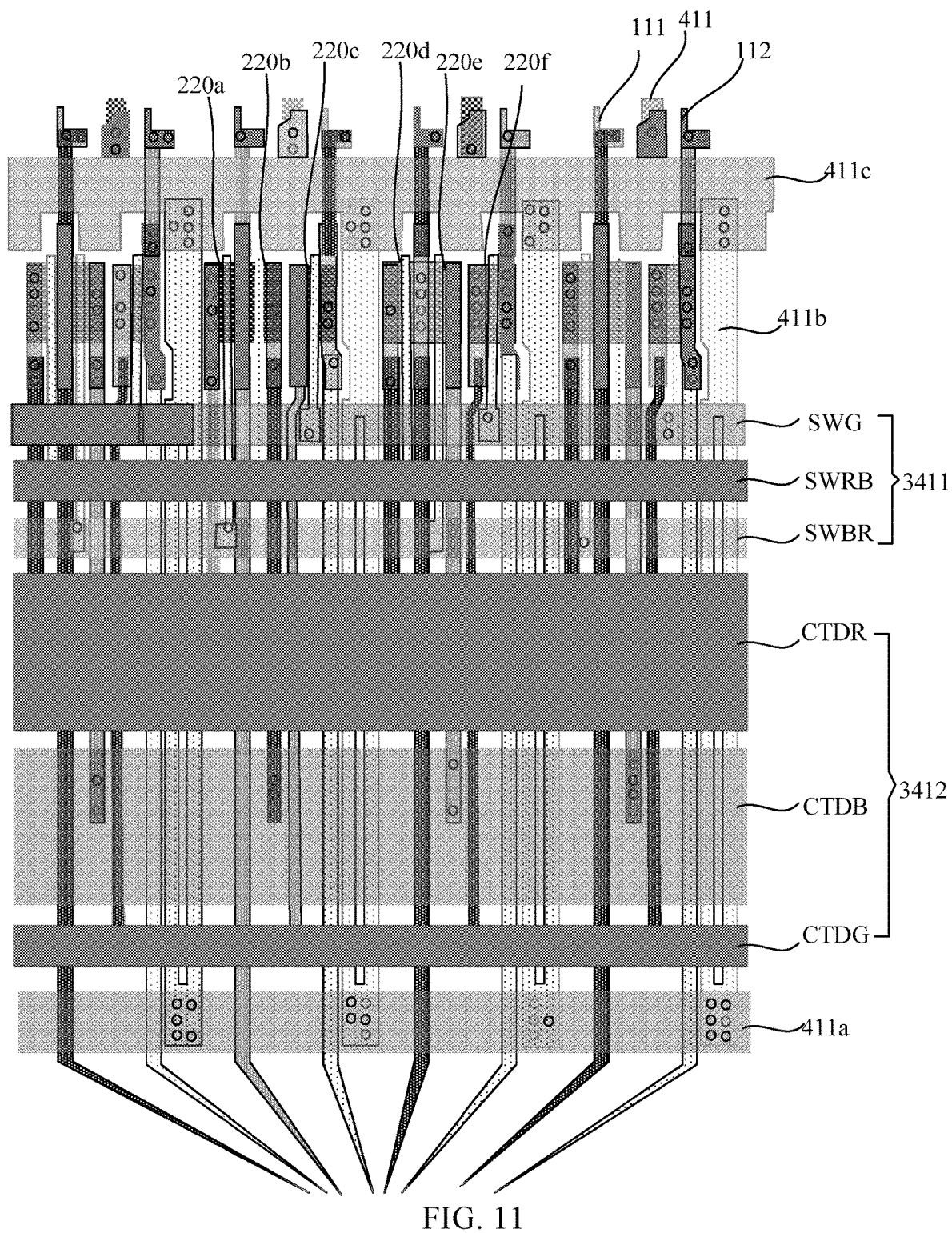
FIG. 11 is a schematic structural diagram of a test unit in a display substrate according to an embodiment of the present disclosure.

In an exemplary embodiment, as shown in FIG. 1 and FIG. 11, the peripheral region 30 further includes a plurality of test units 330, at least one test data signal line 3412, and at least one test control signal line 3411, wherein at least one of the plurality of test units 22 is electrically connected with at least one of the plurality of data lines 11, at least one test data signal line 3412, and at least one test control signal line 3411, and is configured to deliver a signal transmitted by at least one test data signal line 3412 to at least one data line 11 according to a signal transmitted by at least one test control signal line 3411.

In an exemplary embodiment, as shown in FIG. 4 to FIG. 5, FIG. 7 to FIG. 8, in a direction perpendicular to a display substrate, the display substrate may include: a substrate 100, a first insulating layer 200 disposed on the substrate 100, an active layer 300 disposed on the first insulating layer 200, a second insulating layer 400 disposed on the active layer 300, a first gate metal layer 500 disposed on the second insulating layer 400, a third insulating layer 600 disposed on the first gate metal layer 500, a second gate metal layer 700 disposed on the third insulating layer 600, a fourth insulating layer 800 disposed on the second gate metal layer 700, and a first source-drain metal layer 900 disposed on the fourth insulating layer 800.

In an exemplary embodiment, as shown in FIG. 3A and FIG. 6, at least part of the first connecting line 303 is disposed on a same layer as at least one of the first gate metal layer 500, the second gate metal layer 700, or the first source-drain metal layer 900.

In an exemplary embodiment, the first bonding power supply pin 311, the second bonding power supply pin 312, the first test power supply pin 321, and the second test power supply pin 322 are all disposed on a same layer as the first source-drain metal layer 900. The first connecting line 303 and the first test power lead 323 are both disposed on a same layer as the second gate metal layer 700, the first bonding power lead 313, the second bonding power lead 314, the second connecting line 304, and the second test power lead 324 are all disposed on a same layer as the first source-drain metal layer 900, the first connecting line 304 is connected with the first bonding power lead 313 through a via hole on the fourth insulating layer 800, and the first test power lead 323 is connected with the first test power supply pin 321 through a via hole on the fourth insulating layer 800.

"A and B are disposed on a same layer" described in the present disclosure means that A and B are formed at the same time by one same patterning process.

In an exemplary embodiment, the first connecting line 303 and the first test power lead 323 may be integrated to each other.

In an exemplary embodiment, the first bonding power supply pin 311 and the first bonding power lead 313 may be integrated to each other.

In an exemplary embodiment, the second bonding power supply pin 312 and the second bonding power lead 314 may be integrated to each other.

In an exemplary embodiment, the second test power supply pin 322, the second test power lead 324, and the second connecting line 304 may be integrated to each other.

In an exemplary embodiment, the first power supply line 411 is a positive voltage power supply line (ELVDD), and the second power supply line 412 is a negative voltage power supply line (ELVSS).

Figure 4:
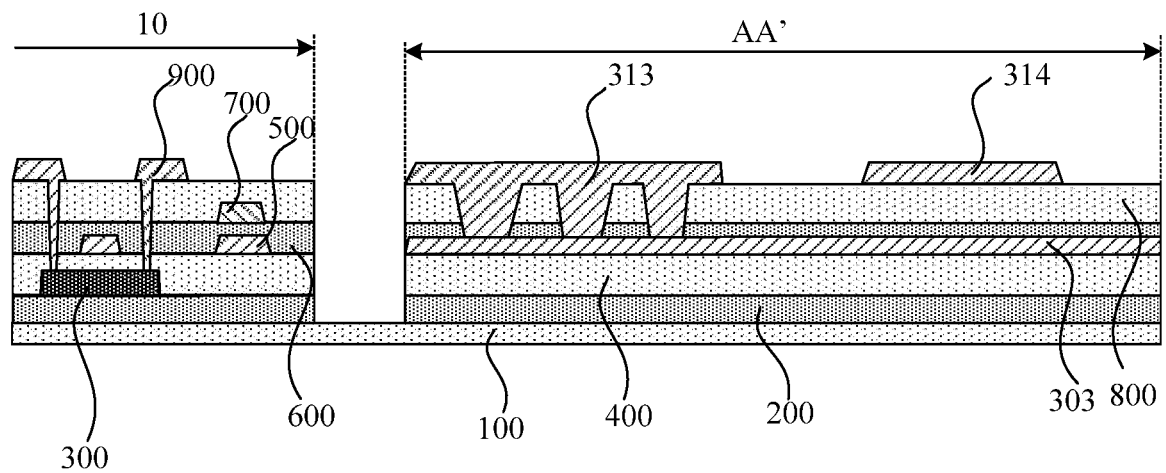
FIG. 4 is a schematic cross-sectional view of one sub-pixel of a display region in FIG. 1 and an AA' region in FIG. 3B.
Figure 5:
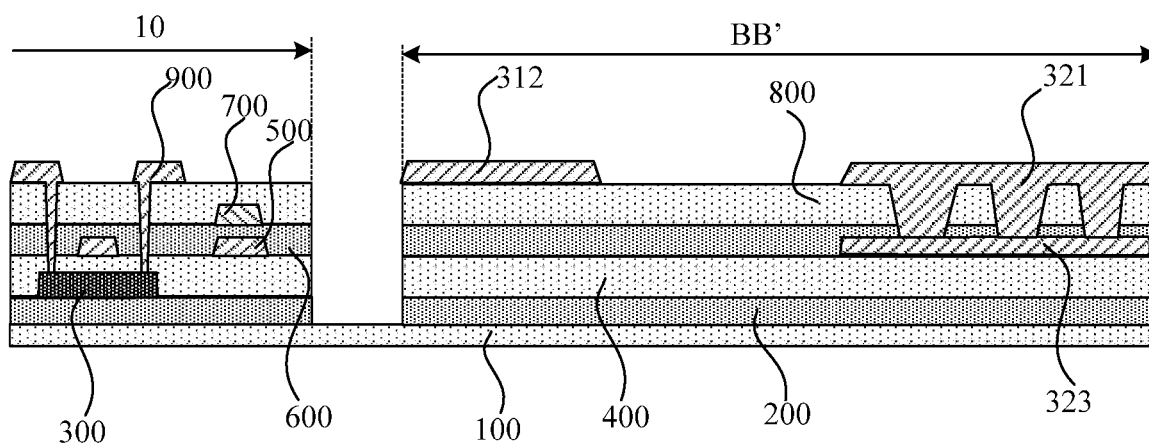
FIG. 5 is a schematic cross-sectional view of one sub-pixel of a display region in FIG. 1 and a BB' region in FIG. 3B.

In another exemplary embodiment, as shown in FIGS. 3 to 5, the first bonding power supply pin 311, the second bonding power supply pin 312, the first test power supply pin 321, and the second test power supply pin 322 are all disposed on a same layer as the first source-drain metal layer 900. The first connecting line 303 and the first test power lead 323 are both disposed on a same layer as the first gate metal layer 500, the first bonding power lead 313, the second bonding power lead 314, the second connecting line 304, and the second test power lead 324 are all disposed on a same layer as the first source-drain metal layer 900, the first connecting line 304 is connected with the first bonding power lead 313 through a via hole penetrating through the third insulating layer 600 and the fourth insulating layer 800, and the first test power lead 323 is connected with the first test power supply pin 321 through a via hole penetrating through the third insulating layer 600 and the fourth insulating layer 800.

In another exemplary embodiment, the first bonding power supply pin 311, the second bonding power supply pin 312, the first test power supply pin 321, and the second test power supply pin 322 are all disposed on a same layer as the first source-drain metal layer 900; the first connecting line 303 is disposed on a same layer as the first gate metal layer 500, and the first bonding power lead 313, the second bonding power lead 314, the second connecting line 304, the first test power lead 323, and the second test power lead 324 are all disposed on a same layer as the first source-drain metal layer 900. The first connecting line 303 is respectively connected with the first bonding power lead 313 and the first test power lead 323 through the via hole penetrating through the third insulating layer 600 and the fourth insulating layer 800.

In another exemplary embodiment, as shown in FIG. 6, the circuit board pin region 31 includes the first bonding power lead 313 and the second bonding power lead 314, wherein the first bonding power lead 314 electrically connects the first power supply line 411 and the first bonding power supply pin 311, and the second bonding power lead 314 electrically connects the second power supply line 412 and the second bonding power lead 312; and the test pin region 32 includes the first test power supply pin 321, the second test power supply pin 322, the first test power lead 323 connected with the first test power supply pin 321, and the second test power lead 324 connected with the second test power supply pin 322.

The display substrate further includes the first connecting line 303, wherein the first connecting line 303 electrically connects the first bonding power lead 313 and the first test power lead 323.

In an exemplary embodiment, the display substrate may further include a fifth insulating layer and a first flat layer disposed on the first source-drain metal layer 900, and a second source-drain metal layer disposed on the first flat layer. The first bonding power supply pin 311, the second bonding power supply pin 312, the first test power supply pin 321 and the second test power supply pin 322, the first bonding power lead 313 and the second bonding power lead 314, the second connecting line 304, and the first test power lead 323 and the second test power lead 324 may be disposed on a same layer as the second source-drain metal layer, and the first connecting line 303 may be disposed on a same layer as the first source-drain metal layer 900, the second gate metal layer 700, or the first gate metal layer 500, which is not limited in the present disclosure.

In an exemplary embodiment, a width of the first connecting line 303 is larger than a first width. Illustratively, the first width may be 200 microns. If an overlapping position of the first connecting line 303 and the second bonding power lead 314 has too large resistance, it is easy to cause current concentration during a high brightness process, thus generating relatively large heat, so that an organic layer such as an upper insulating layer or a flat layer, etc., is caused to be burned, carbonize or fall off in a serious case, and then water vapor easily enters, resulting in poor reliability. According to the embodiment of the present disclosure, by designing the first connecting line 303 as wide as possible, using space wiring as much as possible, and reducing a metal wiring resistance at a line switching position as much as possible, problems of being burned, carbonization, falling down in a serious case, and poor reliability further raised etc., for the organic layer such as the upper insulating layer or the flat layer, etc., caused by a large wiring resistance, are avoided.

In an exemplary embodiment, a width of the second connecting line 304 is about 50 microns to 1000 microns. The width of the second connecting line 304 is determined according to a size of the wiring space.

Figure 7:
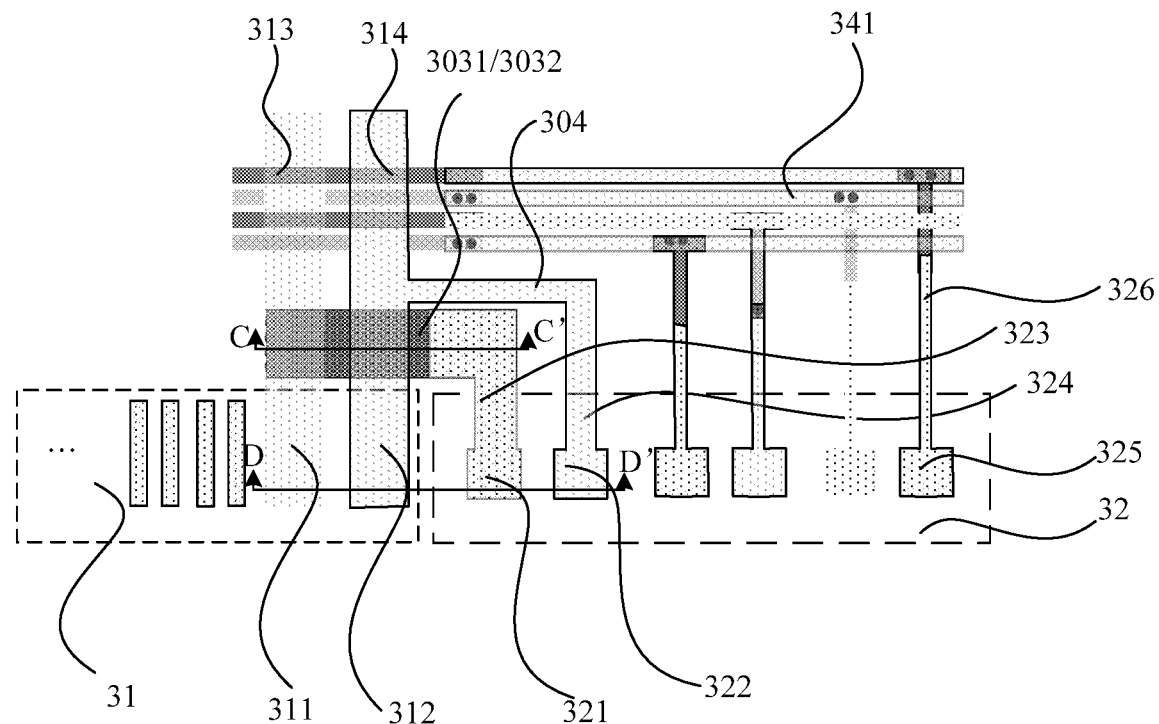
FIG. 7 is a fifth schematic structural diagram of a peripheral region in a display substrate according to an exemplary embodiment of the present disclosure.
Figure 8:
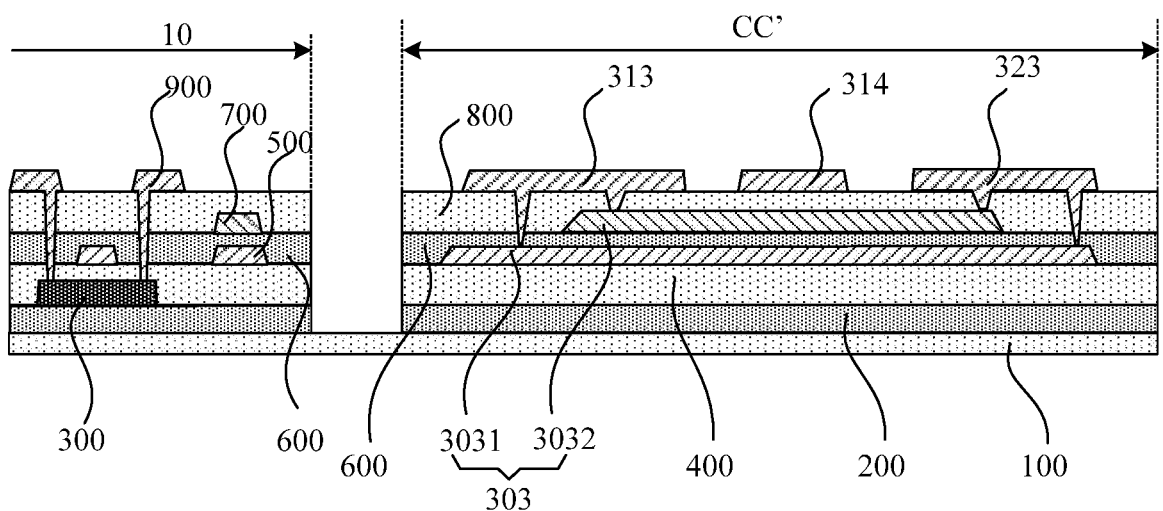
FIG. 8 is a schematic cross-sectional view of one sub-pixel of a display region in FIG. 1 and a CC' region in FIG. 7.

In an exemplary embodiment, a distance between a orthographic projection, on the substrate 100, of an edge of the first connecting line 303 on one side close to the first test power lead 323 connected with the first connecting line 303, and a orthographic projection, on the substrate 100, of an edge of the second bonding power lead 314 on one side close to the first test power lead 323 is less than a first distance. A size of the first distance may be determined according to a cross connection width between the first test power lead 323 and the first connecting line 303. According to the embodiment of the present disclosure, after the first connecting line 303 crosses an avoided second bonding power lead 314, the first test power lead 323 with a small resistance is switched back through line jumping as early as possible, it is also possible to reduce the metal wiring resistance at the line switching position as much as possible, avoiding problems of being burned, carbonization, falling down in a serious case, and poor reliability further raised etc., for the organic layer such as the upper insulating layer or the flat layer, etc., caused by a large wiring resistance. As shown in FIGS. 7 and 8, the first connecting line 303 includes a first sub-connecting line 3031 and a second sub-connecting line 3032, wherein the first sub-connecting line 3031 is disposed on a same layer as the first gate metal layer 500, the second sub-connecting line 3032 is disposed on a same layer as the second gate metal layer 700, and the first sub-connecting line 3031 and the second sub-connecting line 3032 are connected in parallel and electrically. The first sub-connecting line 3031 is at least partially overlapped with the first bonding power lead 313, and the second bonding power lead 314, and the second sub-connecting line 3032 is at least partially overlapped with the first bonding power lead 313, and the second bonding power lead 314.

According to the embodiment of the present disclosure, through using the first sub-connecting line 3031 on the first gate metal layer 500 and the second sub-connecting line 3032 on the second gate metal layer 700 for parallel wiring, the metal wiring resistance at the switching position is further reduced, avoiding problems of being burned, carbonization, falling down in a serious case, and poor reliability further raised etc., for the organic layer such as the upper insulating layer or the flat layer, etc., caused by a large wiring resistance.

As shown in FIG. 3A and FIG. 6, the first connecting line 303 includes the first sub-connecting line 3031 and a third sub-connecting line 3033, wherein the first sub-connecting line 3031 is electrically connected with the third sub-connecting line 3033, and the first sub-connecting line 3031 is at least partially overlapped with the first bonding power lead 313, and the second bonding power lead 314, the third sub-connecting line 3033 is not overlapped with the first bonding power lead 313, or the second bonding power lead 314, the first sub-connecting line 3031 is disposed on a same layer as the first gate metal layer 500, and the third sub-connecting line 3033 is disposed on a same layer as the first source-drain metal layer 900.

Figure 9:
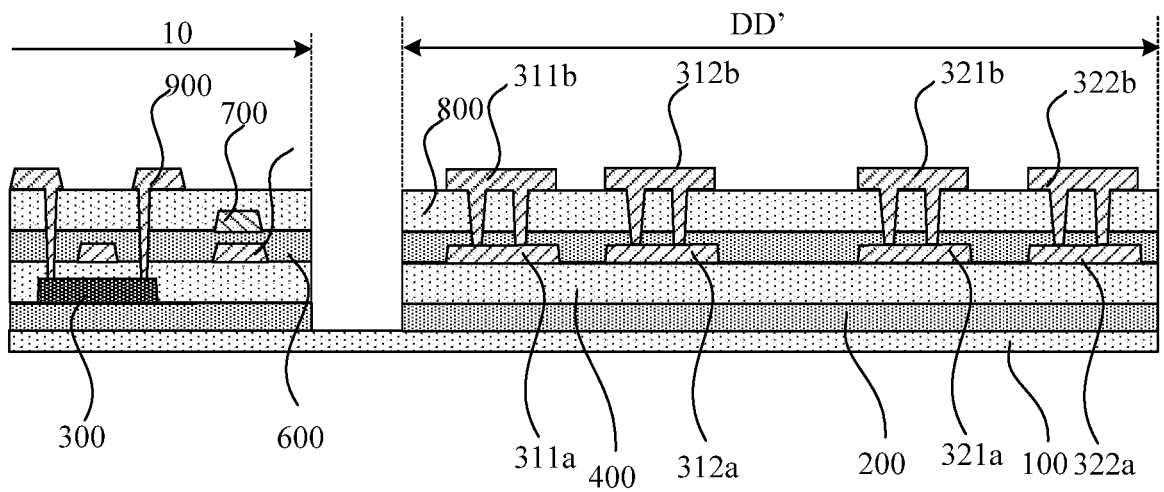
FIG. 9 is a schematic cross-sectional view of one sub-pixel of a display region in FIG. 1 and a DD' region in FIG. 7.

In an exemplary embodiment, as shown in FIG. 9, the first test power supply pin 321 includes a first sub-layer 321a and a second sub-layer 321b, wherein the first sub-layer 321a may be electrically connected with the second sub-layer 321b, the first sub-layer 321a may be disposed on a same layer as the first gate metal layer 500, and the second sub-layer 321b may be disposed on a same layer as the first source-drain metal layer 900. According to the display substrate of the embodiment of the present disclosure, by setting the first sub-layer 321a and the second sub-layer 321b, a height of the first test power supply pin 321 may be blocked up, which is beneficial to CellTest. In addition, since a signal lead of the first test power supply pin 321 is usually led out from the first gate metal layer 500, the disposed first sub-layer 321a is also beneficial to lead out the signal lead of the first test power supply pin 321.

In an exemplary embodiment, as shown in FIG. 9, the second test power supply pin 322 includes a third sub-layer 322a and a fourth sub-layer 322b, wherein the third sub-layer 322a and the fourth sub-layer 322b are electrically connected, the third sub-layer 322a may be disposed on a same layer as the first gate metal layer 500, and the fourth sub-layer 322b may be disposed on a same layer as the first source-drain metal layer 900. According to the display substrate of the embodiment of the present disclosure, by disposing the third sub-layer 322a and the fourth sub-layer 322b, a height of the second test power supply pin 322 may be supported, which is beneficial to CellTest. In addition, because a signal lead of the second test power supply pin 322 is usually led out from the first gate metal layer 500, the disposed third sub-layer 322a is also beneficial to lead out the signal lead of the second test power supply pin 322.

In an exemplary embodiment, as shown in FIG. 9, the second bonding power supply pin 312 includes a fifth sub-layer 312a and a sixth sub-layer 312b, wherein the fifth sub-layer 312a may be electrically connected with the sixth sub-layer 312b, the fifth sub-layer 312a may be disposed on a same layer as the first gate metal layer 500, and the sixth sub-layer 312b may be disposed on a same layer as the first source-drain metal layer 900. According to the display substrate of the embodiment of the present disclosure, by setting the fifth sub-layer 312a and the sixth sub-layer 312b, a height of the second bonding power supply pin 312 may be blocked up, which is beneficial to signal bonding. In addition, since a signal lead of the second bonding power supply pin 312 is usually led out from the first gate metal layer 500, the disposed fifth sub-layer 312a is also beneficial to lead out the signal lead of the second bonding power supply pin 312.

In an exemplary embodiment, as shown in FIG. 9, the first bonding power supply pin 311 includes a seventh sub-layer 311a and an eighth sub-layer 311b, wherein the seventh sub-layer 311a and the eighth sub-layer 311b are electrically connected, the seventh sub-layer 311a may be disposed on a same layer as the first gate metal layer 500, and the eighth sub-layer 311b may be disposed on a same layer as the first source-drain metal layer 900. According to the display substrate of the embodiment of the present disclosure, by setting the seventh sub-layer 311a and the eighth sub-layer 311b, a height of the first bonding power supply pin 311 may be blocked up, thus being beneficial to signal bonding. In addition, since a signal lead of the first bonding power supply pin 311 is usually led out from the first gate metal layer 500, the disposed seventh sub-layer 311a is also beneficial to lead out the signal lead of the first bonding power supply pin 311.

In another exemplary embodiment, the first sub-layer 321a, the third sub-layer 322a, the fifth sub-layer 312a, and the seventh sub-layer 311a may alternatively be disposed on a same layer as the second gate metal layer 700, which is not limited by the present disclosure. In an exemplary embodiment, as shown in FIG. 7, the display substrate further includes a plurality of test signal lines 341. The test pin region 32 further includes a plurality of test pins 325, and a plurality of test connecting lines 326 connected with the test pins 325 in one-to-one correspondence.

Referring to FIG. 1, the display substrate according to the embodiment of the present disclosure is divided into a plurality of regions, a display region 10 (or an AA region) for displaying is located in the middle, and sub-pixels 1 (or referred to as sub pixel) for displaying are disposed in the display region 10. It should be understood that each unit (including the driving unit 21, the test unit 22, etc.) and the sub-pixels 1 in FIG. 1 are represented by "rectangle", which is only schematic, and regions occupied by them are not necessarily rectangular. For an actual display substrate, each unit (including the driving unit 21, the testing unit 22, etc.) only corresponds to a very small part of the peripheral region, so in part of subsequent drawings, many structures at a local part of each unit are approximately treated as straight lines. It should be understood that, due to the limitation on areas, shapes, sizes, size ratios, numbers, number ratios, positions, etc. of various structures such as leads (for example signal lines), joints, cells and regions of sub-pixels 1 in many drawings of the embodiments of the present disclosure are only exemplary, and are not limitations on the embodiments of the present disclosure. For example, quantities of actual test signal lines 341, driving signal lines 341, etc., should be more than those shown in FIG. 1.

In the embodiment of the present disclosure, the sub-pixel 1 refers to a smallest structure that may be used for independently displaying a required content, that is, a smallest "point" that may be independently controlled in the display device. Specific forms of the sub-pixels 1 are various, as long as independent display can be implemented.

That is, in each sub-pixel 1 of the display substrate according to the embodiment of the present disclosure, an Organic Light Emitting Diode (OLED) may be used as a light emitting device, which is specifically an organic light emitting diode display substrate.

Herein, different sub-pixels 1 may have different colors, so that color display may be achieved by mixed light of the different sub-pixels 1. Herein, when color display is to be implemented, one pixel (or pixel unit) is formed by a plurality of sub-pixels 1 of different colors arranged together, that is, light emitted by these sub-pixels 1 is mixed together to become one visual "point"; for example, it may be that three sub-pixels 1 of three colors, that is, red, green, and blue, form one pixel. Or, there may be no explicit pixel (or pixel unit), and the color display may be achieved by "sharing" between adjacent sub-pixels 1.

Referring to FIG. 1, the data lines 11 extending along the first direction 991, and the gate lines 12 extending along the second direction 992 are further disposed in the display region 10, wherein the first direction 991 intersects with the second direction 992 (i.e., they are not parallel to each other), so that one sub-pixel 1 may be defined at each intersection of the data lines 11 and the gate lines 12, and the sub-pixel 1 at the intersection of a gate line 12 and a data line 11 may display through controlling by both of the gate line 12 and the data line 11.

In some embodiments, the first direction 991 is perpendicular to the second direction 992, that is, the first direction 991 may be a column direction (a longitudinal direction in FIG. 1) and the second direction 992 may be a row direction perpendicular to the column direction (a transverse direction in FIG. 1).

It should be understood that the first direction 991, and the second direction 992 are actually only two opposite directions corresponding to the data lines 11 and the gate lines 12, which are not necessarily the column direction, or the row direction, and have no necessary relationship with a shape, a location, and a placement mode, etc., of the display substrate (or the display apparatus).

In some embodiments, the sub-pixels 1 in the display region 10 may be arranged in an array, that is, the sub-pixels 1 may be arranged in a plurality of rows, and a plurality of columns, wherein each row of sub-pixels 1 is connected to one gate line 12, and each column of sub-pixels 1 is connected to one data line 11. The sub-pixels 1 are not necessarily arranged in an array, and each data line 11 and gate line 12 are not necessarily connected to the sub-pixels in a same column, or in a same row.

A pin (Pad or Pin) in the embodiment of the present disclosure refers to a structure in the display substrate that may acquire another signal and introduce the signal into a signal line. The pin may be used for bonding connection with a flexible circuit board (FPC) or a driving chip, so as to acquire a signal from the flexible circuit board or the driving chip. Or, the pin may be used for contacting with a test probe of a test apparatus, so as to obtain a signal from the test probe.

Referring to FIG. 1, the peripheral region 30 may be divided into a first half region and a second half region "(a left half region and a right half region in FIG. 1)" along the second direction 992 which are opposite to each other at two sides of the display region 10. Herein, since the gate lines 12 extend along the second direction 992, all the gate lines 12 all correspond to the first half region (the left half region in FIG. 1). Therefore, the driving units 21 in the first half region may be the gate driving units 211 that provide gate driving signals to the a plurality of gate lines 12, so that the gate driving units 211 are connected to corresponding gate lines 12 nearby.

In an exemplary embodiment, each gate driving unit 211 may be one gate shift register (GOA), and a plurality of gate shift registers are cascaded, so that the plurality of gate shift registers may provide driving signals to the plurality of gate lines 12 respectively.

In some embodiments, the display region 10 further includes a plurality of control electrode lines 13 extending along the second direction 992, wherein each control electrode line 13 is connected with the a plurality of sub-pixels 1; driving units 21 located in the second half region are control electrode driving units 212, wherein the control electrode driving units 212 are configured to provide control electrode driving signals to the plurality of control electrode lines 13.

Referring to FIG. 1, control electrode lines 13 similarly extending along the second direction 992 may also be disposed in the display region 10, wherein each control electrode line 13 may be connected to one or two rows of sub-pixels 1.

Herein, because the control electrode lines 13 also extend along the second direction 992, all the control electrode lines 13 all correspond to the second half region (the right half region in FIG. 1). Therefore, the driving units 21 in the second half region may be control electrode driving units 212 that provide control electrode driving signals to the plurality of control electrode lines 13, so that the control electrode driving units 212 are connected to the corresponding control electrode lines 13 nearby.

Of course, the specific form of the above driving unit 21 is not a limitation on the embodiment of the present disclosure. For example, the driving units 21 in the two half regions may alternatively be both gate driving units 211, and provide gate driving signals to different gate lines 12 respectively, or provide gate driving signals for each gate line 12 from two sides at the same time (that is, double-sided driving).

In an exemplary embodiment, each control driving unit 212 may be a control shift register (EM GOA), and a plurality of control shift registers are cascaded, so that the plurality of control shift registers may provide driving signals to the plurality of control electrode lines 13 respectively.

In some embodiments, the test signal line 341 includes a test control line 3411 and a test data line 3412; at least one test unit 22 includes a plurality of test transistors 220; a gate of each test transistor 220 is connected to one test control line 3411, a first electrode is connected to one data line 11, and a second electrode is connected to one test data line 3412; and each test data line 3412 is connected with the plurality of test units 22.

Figure 10:
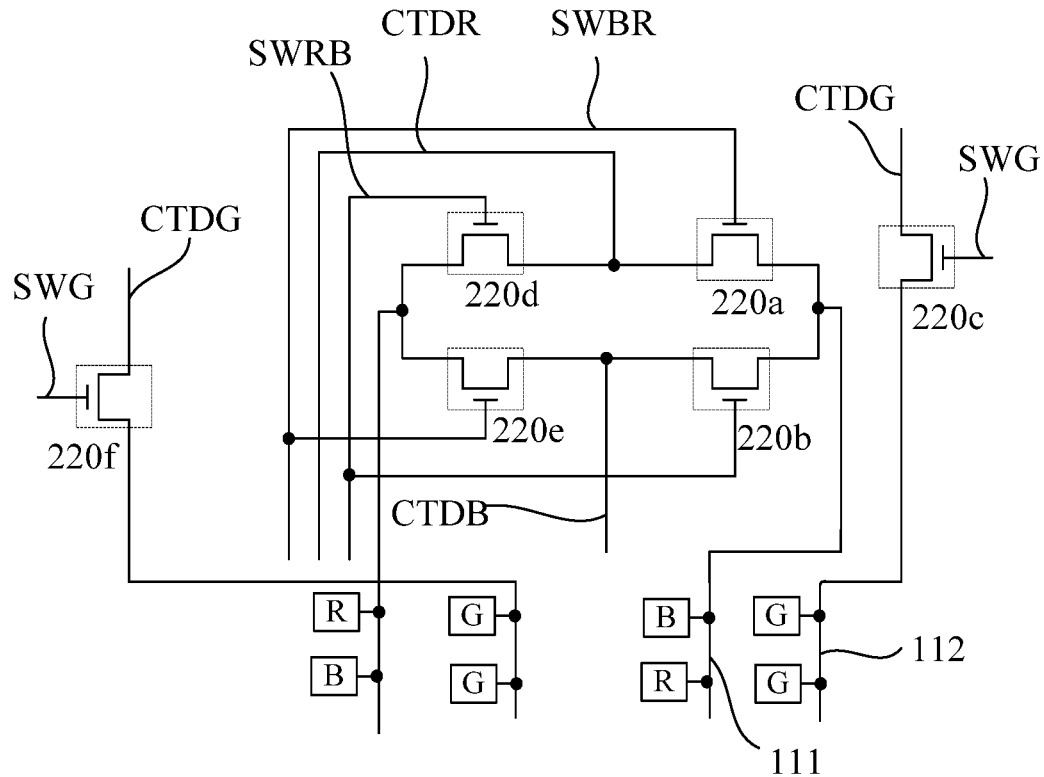
FIG. 10 is a schematic diagram of a circuit of a test unit in a display substrate according to an embodiment of the present disclosure.

Referring to FIGS. 10 and 11, the display substrate of the present embodiment has a total of three test data signal lines 3412 and three test control signal lines 3411, each test unit 22 includes six test transistors for controlling four data lines 11 (corresponding to the above four columns of sub-pixels 1, two columns of sub-pixels 1 are green in every four columns of sub-pixels 1, red and blue sub-pixels 1 are alternately arranged in every column of the remaining two columns of sub-pixels 1, and two sub-pixels 1 in any same row are blue and red respectively, in the two columns of sub-pixels 1), and each test unit 22 includes a first test transistor 220a, a second test transistor 220b, a third test transistor 220c, a fourth test transistor 220d, a fifth test transistor 220e, and a sixth test transistor 220f, wherein drains of the first test transistor 220a and the second test transistor 220b are connected to one column of red and blue mixed sub-pixels 1, drains of the fourth test transistor 220d and the fifth test transistor 220d are connected to another column of red and blue mixed sub-pixels 1, a drain of the third test transistor 220c is connected to one column of green sub-pixels 1, a drain of the sixth test transistor 220f is connected to another column of green sub-pixels 1, sources of the first test transistor 220a and the fourth test transistor 220d are connected to a first test data signal line CTDR, sources of the second test transistor 220b and the fifth test transistor 220e are connected to a second test data signal line CTDB, sources of the third test transistor 220c and the sixth test transistor 220f are connected to a third test data signal line CTDG, the gates of the first test transistor 220a and the fifth test transistor 220e are connected to a third test control signal line SWBR, and the gates of the second test transistor 220b and the fourth test transistor 220d are connected to a second test control signal line SWRB; and the gates of the third test transistor 220c and the sixth test transistor 220f are connected to a first test control signal line SWG.

It can be seen from the above arrangement that turn-on signals are supplied to the second test control signal line SWRB and the third test control signal line SWBR in turn, that is, the first test data signal line CTDR and the second test data signal line CTDB can respectively control the blue and red sub-pixels 1, while the first test control signal line SWG and the third test data signal line CTDG can control all the green sub-pixels 1, so that sub-pixels 1 of the same color can display the same brightness.

Referring to FIG. 10, two columns of sub-pixels 1 may be green in every four columns of sub-pixels 1, and red and blue sub-pixels 1 are alternately arranged in each of the remaining two columns of sub-pixels 1, and two sub-pixels 1 in any same row are blue and red respectively, in the two columns of sub-pixels 1.

Figure 12:
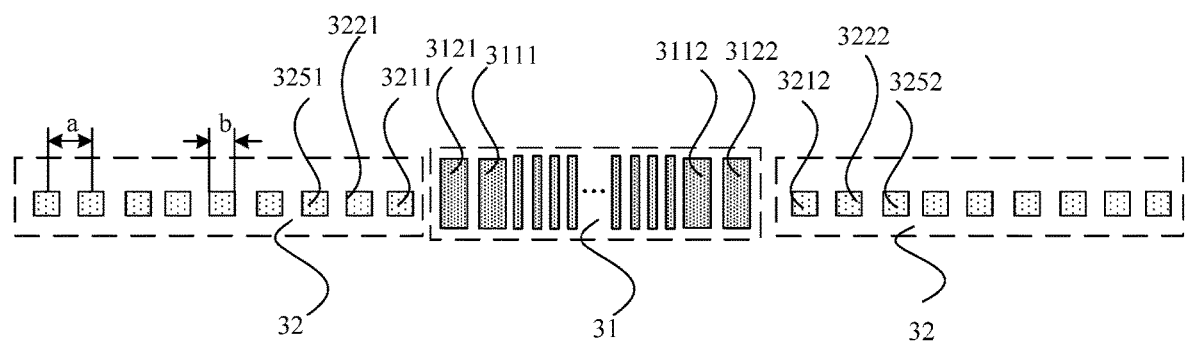
FIG. 12 is a sixth schematic structural diagram of a peripheral region in a display substrate according to an exemplary embodiment of the present disclosure.

In an exemplary embodiment, as shown in FIG. 12, various pins of the test pin region 32 (including the test pin 325, the first test power supply pin 321, and the second test power supply pin 322) have a square shape, and a distance between center points of adjacent pins is larger than a preset first distance, and a width b of each pin is larger than a preset second width.

In an embodiment of the present disclosure, the test pin region 32 may be subjected to a unit test by crimping or pin-sticking.

In an exemplary embodiment, when the unit test is performed in a pin-sticking mode, the distance between the center points of adjacent pins is between 500 and 1200 microns, and the width of each pin is between 200 and 800 microns.

In another exemplary embodiment, when the unit test is performed by crimping, the distance between the center points of adjacent pins is between 150 and 300 microns, and the width of each pin is between 100 and 220 microns.

Compared with the crimping mode, the test pin region required by the pin-sticking mode is relatively wide, and when space permits, the unit test may be performed by using the pin-sticking mode.

In an exemplary embodiment, the substrate 100 is a rigid substrate or a flexible substrate.

In an exemplary embodiment, the first bonding power supply pin 311, the second bonding power supply pin 312, the first test power supply pin 321, and the second test power supply pin 322 are all disposed on a same layer as the first source-drain metal layer 900; the first connecting line 303 and the first test power lead 323 are disposed on a same layer as the first gate metal layer 500, and the first bonding power lead 313, the second bonding power lead 314, the second connecting line 304, and the second test power lead 324 are all disposed on a same layer as the first source-drain metal layer 900.

The first connecting line 303 is connected with the first bonding power lead 313 through via holes on the third insulating layer 600 and the fourth insulating layer 800, and the first test power pin 321 is connected with the first test power lead 323 through the via holes on the third insulating layer 600 and the fourth insulating layer 800.

In an exemplary embodiment, in the direction perpendicular to the display substrate, the display substrate includes the substrate 100, and the first insulating layer 200, the active layer 300, the second insulating layer 400, the first gate metal layer 500, the third insulating layer 600, the second gate metal layer 700, the fourth insulating layer 800, the first source-drain metal layer 900, the fifth insulating layer, the first flat layer, and an anode layer which are stacked on the substrate 100; the test pin region 32 includes a first test power connection electrode and a second test power connection electrode, and the circuit board pin region 31 includes a first bonding power connection electrode and a second bonding power connection electrode, wherein the first test power connection electrode, the second test power connection electrode, the first bonding power connection electrode, and the second bonding power connection electrode are disposed on a same layer as the anode layer.

The first bonding power supply pin 311, the second bonding power supply pin 312, the first test power supply pin 321, and the second test power supply pin 322 are all disposed on a same layer as the first source-drain metal layer 900. The first bonding power supply connection electrode is connected with the first bonding power supply pin 311 through a first connection electrode, the second bonding power supply connection electrode is connected with the second bonding power supply pin 312 through a second connection electrode, the first test power supply connection electrode is connected with the first test power supply pin 321 through a third connection electrode, and the second test power supply connection electrode is connected with the second test power supply pin 322 through a fourth connection electrode; the first connecting line 303 is disposed on a same layer as the first gate metal layer 500, and the first bonding power lead 313, the second bonding power lead 314, the second connecting line 304, the first test power lead 323, and the second test power lead 324 are all disposed on a same layer as the first source-drain metal layer 900. The first connecting line 303 is connected with the first bonding power lead 313 and the first test power lead 323 through a via hole on the fourth insulating layer 800.

In an exemplary embodiment, as shown in FIG. 12, the first bonding power supply pin 311 includes a first sub-pin 3111 and a second sub-pin 3112, and the second bonding power supply pin 312 includes a third sub-pin 3121 and a fourth sub-pin 3122, wherein the third sub-pin 3121 is located on one side of the first sub-pin 3111 away from the second sub-pin 3112, and the fourth sub-pin 3122 is located on one side of the second sub-pin 3112 away from the first sub-pin 3111.

In an exemplary embodiment, as shown in FIG. 12, test power supply pins include a first test power supply pin 321 and a second test power supply pin 322, wherein the first test power supply pin 321 includes a fifth sub-pin 3211 and a sixth sub-pin 3212, the second test power supply pin 322 includes a seventh sub-pin 3221 and an eighth sub-pin 3222, the seventh sub-pin 3221 is located on one side of the fifth sub-pin 3211 away from the circuit board pin region 31, and the eighth sub-pin 3222 is located on one side of the sixth sub-pin 3212 away from the circuit board pin region 31.

In an exemplary embodiment, as shown in FIG. 12, the test pin region 32 further includes at least one first test pin 3251 and at least one second test pin 3252, wherein the first test pin 3251 is located on one side of the seventh sub-pin 3221 away from the circuit board pin region 31, and the second test pin 3252 is located on one side of the eighth sub-pin 3222 away from the circuit board pin region 31.

The display substrate according to an embodiment of the present disclosure is a substrate used in a display apparatus, for example, an array substrate disposed with a Thin Film Transistor (TFT) array. In an exemplary embodiment, the bonding region 30 may include an anti-static circuit configured to eliminate static electricity, an isolation dam configured to block water vapor from entering the display region 10, and another wiring region, which is not limited here in the present disclosure.

In an exemplary embodiment, the circuit board pin region 31 may be disposed with another pin, which is not limited here in the present disclosure.

The following is an exemplary explanation through a preparation process of the display substrate. The "patterning process" described in the present disclosure includes treatments such as photoresist coating, mask exposure, development, etching and photoresist stripping for metal materials, inorganic materials or transparent conductive materials, and includes treatments such as organic material coating, mask exposure and development for organic materials. Deposition may include any one or more of sputtering, vapor deposition and chemical vapor deposition, coating may include any one or more of spraying coating, spin coating and ink-jet printing, and etching may include any one or more of dry etching and wet etching, which are not limited in the present disclosure. A "thin film" refers to a layer of thin film manufactured by a certain material on a substrate using deposition, coating or other processes. If the "thin film" does not need the patterning process throughout the manufacturing process, the "thin film" may also be called a "film" before the patterning process, and is called a "layer" after the patterning process. If the "thin film" needs the patterning process throughout the manufacturing process, it is called a "thin film" before the patterning process, and called a "layer" after the patterning process. The "layer" after the patterning process contains at least one "pattern". "A and B are disposed on a same layer" mentioned in the present disclosure refers that A and B are formed at the same time by a same patterning process, and the "thickness" of a film is a dimension of the film in a direction perpendicular to the display substrate. In the exemplary embodiments of the present disclosure, "an orthogonal projection of A contains an orthogonal projection of B" means that a boundary of the orthogonal projection of B falls within a boundary range of the orthogonal projection of A, or the boundary of the orthogonal projection of A is overlapped with the boundary of the orthogonal projection of B.

(1) Preparing a substrate 100 on a glass carrier plate. In the exemplary embodiment, the substrate 100 may include a first flexible material layer, a first inorganic material layer, a semiconductor layer, a second flexible material layer and a second inorganic material layer stacked on a glass carrier. Materials of the first and second flexible material layers may include polyimide (PI), polyethylene terephthalate (PET) or polymer soft film after surface treatment, and materials of the first and second inorganic material layers may include silicon nitride (SiNx) or silicon oxide (SiOx) to improve the anti-water-oxygen capability of the substrate. The first and second inorganic material layers may also be called barrier layers, and amorphous silicon (a-si) may be used as a material of the semiconductor layer. In an exemplary embodiment, taking a stacked structure of PI1/Barrier1/a-si/PI2/Barrier2 as an example, a preparing process thereof may include: first, one layer of polyimide is coated on a glass carrier plate 1, which cures into a film to form a first flexible (PI1) layer; subsequently, one layer of barrier thin film is deposited on the first flexible layer, to form a first barrier (Barrier 1) layer covering the first flexible layer; then one layer of amorphous silicon thin film is deposited on the first barrier layer, to form an amorphous silicon (a-si) layer covering the first barrier layer; then one layer of polyimide is coated again on the amorphous silicon layer, which cures into a film to form a second flexible (PI2) layer; then one layer of barrier thin film is deposited on the second flexible layer, to form a second barrier (Barrier 2) layer covering the second flexible layer, completing manufacturing of the substrate 100.

In an exemplary embodiment, the substrate 100 may be a hard substrate.

(2) A first insulating thin film and an active layer thin film are sequentially deposited on the substrate 100, and by performing patterning processing on the active layer thin film through a patterning process, a first insulating layer 200 covering the whole substrate 100, as well as a pattern of the active layer 300 disposed on the first insulating layer 200 are formed. After this patterning process, the circuit board pin region 31 and the test pin region 32 include the first insulating layer 200 disposed on the substrate 100.

(3) A second insulating thin film and a first metal thin film are sequentially deposited, and by performing patterning processing on the first metal thin film through a patterning process, a second insulating layer 400 covering a pattern of an active layer, as well as a pattern of the first gate metal layer 500 disposed on the second insulating layer 400 are formed, wherein the pattern of the first gate metal layer 500 at least includes a first gate electrode, a first capacitor electrode, and a test signal line, the first gate electrode and the first capacitor electrode are formed in the display region 10, and the test signal line is formed in the test pin region 32.

(4) A third insulating thin film and a second metal thin film are sequentially deposited, and by performing patterning processing on the second metal thin film through a patterning process, a third insulating layer 600 covering the first gate metal layer 500, as well as a pattern of the second gate metal layer 700 disposed on the third insulating layer 600 are formed, wherein the pattern of the second gate metal layer 700 at least includes a second capacitor electrode and the first connecting line 303. A third capacitor electrode is formed in the display region 10, a position of the second capacitor electrode corresponds to a position of the first capacitor electrode, and the first connecting line 303 is formed in the peripheral region 30. The first connecting line 303 is configured to connect the first bonding power lead 313 and the first test power lead 323 subsequently formed, so that connecting of the first bonding power lead 313 and the first test power lead 323 are simultaneously achieved through the first connecting line 303, ensuring signal transmission.

(5) A fourth insulating thin film is deposited, and by performing patterning processing on the fourth insulating thin film through a patterning process, a pattern of the fourth insulating layer 800 covering the second gate metal layer 700 is formed, wherein a plurality of via holes are opened on the fourth insulating layer 800, and the plurality of via holes at least include two first active via holes and two first via holes.

In an exemplary embodiment, two first active via holes are formed in the display region 10, and the fourth insulating layer 800, the third insulating layer 600, and the second insulating layer 400 in the two first active via holes are etched away, exposing a surface of a first active layer.

In an exemplary embodiment, the two first via holes are formed in the peripheral region 30, and the fourth insulating layer 800 in the first via holes is etched away, exposing a surface of the first connecting line 303.

In an exemplary embodiment, the two first active via holes are configured to make a first source electrode and a first drain electrode formed subsequently to be connected with the first active layer, respectively. The two first via holes are configured to make the first bonding power lead 313 and the first test power supply line formed subsequently to be connected with the first connecting line 303, respectively, so as to achieve connecting between the first test power supply pin 321 and the first power supply line.

(6) A third metal thin film is deposited, and by performing patterning processing on the third metal thin film by a patterning process, a pattern of the first source-drain metal layer 900 is formed on the fourth insulating layer 800, wherein the first source-drain metal layer 900 at least includes a first source electrode, a first drain electrode, a first bonding power supply pin 311, a second bonding power supply pin 312, a first bonding power lead 313, a second bonding power lead 314, a first power supply line 411, a second power supply line 412, a first test power supply pin 321, a second test power supply pin 322, a first test power lead 323, a second test power lead 324, and a second connecting line 304, as shown in FIG. 3B, FIG. 4, and FIG. 5.

The first source electrode and the first drain electrode are formed in the display region 10, respectively connected with the first active layer through the first active via holes. The first power supply line 411 is formed in the display region 10, the second power supply line 412 is formed in the peripheral region 30, the first power supply line 411 extends from the display region 10 to the peripheral region 30, and is connected with the first bonding power lead 313, and the second power supply line 412 is connected with the second bonding power lead 314.

The first bonding power supply pin 311, the second bonding power supply pin 312, the first bonding power lead 313, and the second bonding power lead 314 are formed in the circuit board pin region 31, the first bonding power supply pin 311 and the first bonding power lead 313 may be integrated to each other, and the second bonding power supply pin 312 and the second bonding power lead 314 may be integrated to each other. The first bonding power lead 313 is connected with the first test power lead 323 through the first via hole.

The first test power supply pin 321, the second test power supply pin 322, the first test power lead 323, and the second test power lead 324 are formed in the test pin region 32, the first test power supply pin 321 and the first test power lead 323 may be integrated to each other, and the second bonding power lead 314 is connected with the second test power lead 324 through the second connecting line 304. The second test power supply pin 322, the second test power lead 324, and the second connecting line 304 may be integrated to each other.

(7) First, one layer of a fifth insulating thin film is deposited on the substrate 100 on which the above patterns are formed, then one layer of a first flat thin film with an organic material is coated, forming the fifth insulating layer covering the whole substrate 100, and a first flat (PLN) layer disposed on the fifth insulating layer. By patterning processes of masking, exposure, and development, an anode via hole is formed on the first flat layer, wherein the anode via hole is formed in the display region 10, and the first flat layer and the fifth insulating layer in the anode via hole are removed, exposing a surface of a first drain electrode of a first transistor. In an exemplary embodiment, the fifth insulating layer and the first flat layer are referred to as composite insulating layers.

In an exemplary embodiment, the composite insulating layer may include only the fifth insulating layer, or only the first flat layer. In a case that the composite insulating layer only includes the first flat layer, the first flat layer may be directly formed on the substrate 100 on which the above patterns are formed, and the first flat layer may be formed on the circuit board pin region 31 and the test pin region 32.

So far, manufacturing of the pattern of the driving structure layer on the substrate 100 is achieved. In the display region 10, the first active layer, the first gate electrode, the first source electrode, and the first drain electrode form a driving transistor in a pixel driving circuit, and the first capacitor electrode and the second capacitor electrode form a storage capacitor in the pixel driving circuit.

In an exemplary embodiment, the display substrate further includes an anode, a pixel define (PDL) layer, a Post Spacer (PS), an organic light emitting layer, a cathode, and an encapsulating layer, wherein the encapsulating layer may include a first encapsulating layer, a second encapsulating layer, and a third encapsulating layer which are stacked, the first encapsulating layer and the third encapsulating layer is made of inorganic material, and the second encapsulating layer is made of organic material.

In an exemplary embodiment, the first, second, third, fourth and fifth insulating layers may be made of any one or more of silicon oxide (SiOx), silicon nitride (SiNx) and silicon oxynitride (SiON), and may be single layer, multiple layers or composite layer. The first insulating layer is called a buffer layer used for improving the anti-water-oxygen capability of the substrate, the second insulating layer and the third insulating layer are called gate insulating (GI) layers, the fourth insulating layer is called an interlayer dielectric (ILD) layer, and the fifth insulating layer is called a passivation (PVX) layer. The first metal thin film, the second metal thin film, the third metal thin film and the fourth metal thin film may be made of metal materials, such as any one or more of silver (Ag), copper (Cu), aluminum (Al), titanium (Ti) and molybdenum (Mo), or alloy materials of the above metals, such as AlNd alloy or MoNb alloy, which may be a single-layer structure or a multilayer composite structure, such as Ti/Al/Ti, etc. The active layer thin film may be made of various materials such as amorphous indium gallium zinc oxide (a-IGZO), zinc oxynitride (ZnON), indium zinc tin oxide (IZTO), amorphous silicon (a-Si), polysilicon (p-Si), hexathiophene and polythiophene, that is, the present disclosure is applicable to transistors manufactured based on an oxide technology, a silicon technology and an organic compound technology.

It may be seen from the structure of the display substrate and the preparation process thereof according to the exemplary embodiment of the present disclosure that in the exemplary embodiment of the present disclosure, through disposing the first test power supply pin and the second test power supply pin in the test pin region, it is caused that the first bonding power supply pin and the second bonding power supply pin in the circuit board pin region will not be damaged during a lighting test of the display substrate, improving reliability of signal input.

The structure of the display substrate and the preparation process thereof according to the exemplary embodiment of the present disclosure are merely an exemplary illustration. In the exemplary embodiments, corresponding structures may be changed and patterning processes may be added or reduced according to actual needs, which is not limited in the present disclosure.

Figure 13:
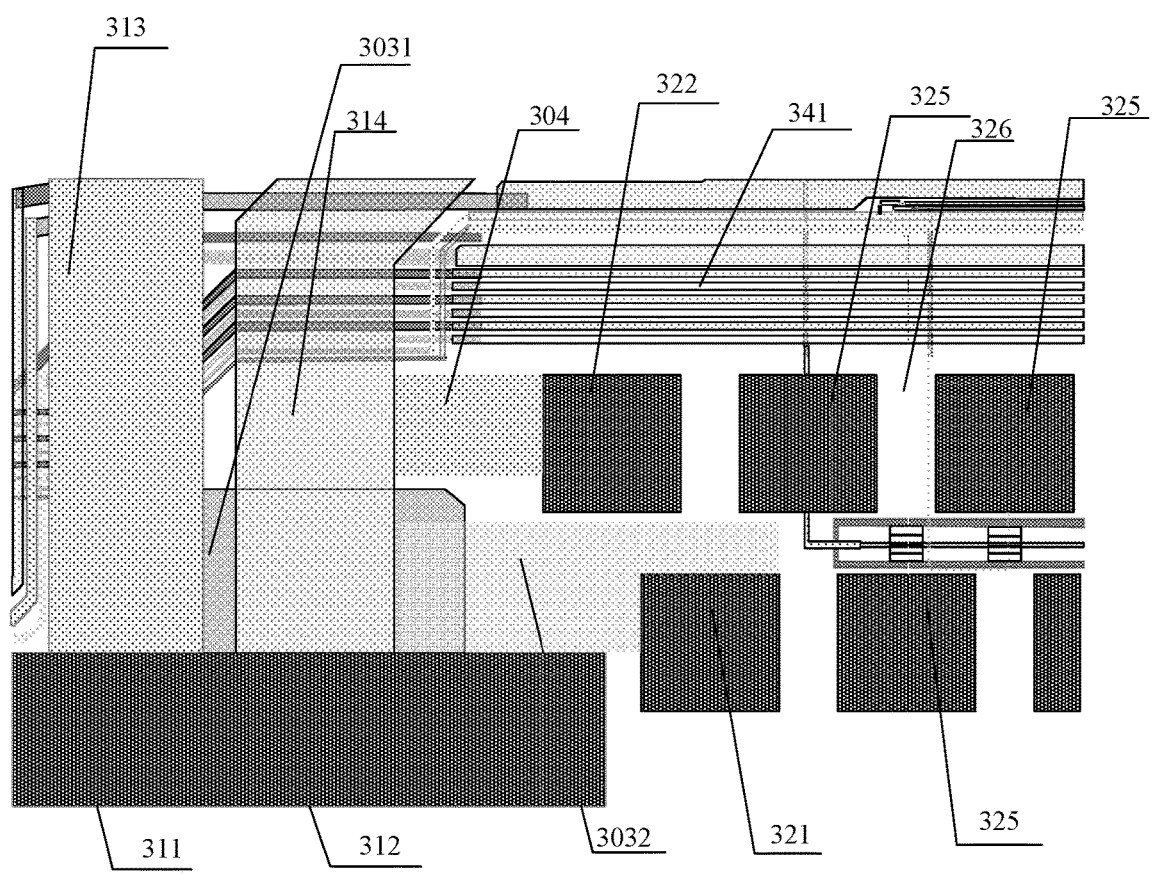
FIG. 13 is a seventh schematic structural diagram of a peripheral region in a display substrate according to an exemplary embodiment of the present disclosure.

FIG. 13 is a schematic plan view of a circuit board pin region and a test pin region according to an exemplary embodiment of the present disclosure. As shown in FIG. 13, the circuit board pin region 31 includes a first bonding power supply pin 311, a second bonding power supply pin 312, a first bonding power lead 313 connected with the first bonding power supply pin 311, and a second bonding power lead 314 connected with the second bonding power supply pin 312, the first power supply line 411 is connected with the first bonding power lead 313, and the second power supply line 412 is connected with the second bonding power lead 314. The test pin region 32 includes a first test power supply pin 321, a second test power supply pin 322, a first test power lead 323 connected with the first test power supply pin 321, and a second test power lead 324 connected with the second test power supply pin 322, the test pin region 32 further includes a plurality of test pins 325, and a plurality of test connecting lines 326 connected with the test pins 325 in one-to-one correspondence, and the test pins 325 and the test connecting lines 326 are disposed on a same layer as the first source-drain metal layer 900. The first connecting line 303 electrically connects the first bonding power lead 313 and the first test power lead 323.

The present disclosure also provides a method for preparing a display substrate, which includes a display region and a peripheral region surrounding the display region, wherein the peripheral region includes a circuit board pin region and a test pin region located on one side of the display region, the display region includes a first power supply line and a plurality of sub-pixels, the peripheral region includes a second power supply line, the circuit board pin region includes at least one first binding power supply pin and at least one second binding power supply pin, and the test pin region includes at least one test power supply pin. In an exemplary embodiment, the manufacturing method includes: a first insulating layer, an active layer, a second insulating layer, a first gate metal layer, a third insulating layer, and a second gate metal layer are sequentially formed on a substrate; a fourth insulating layer is formed on the second gate metal layer; a first source-drain metal layer, a first power supply line, a second power supply line, a first bonding power supply pin, a second bonding power supply pin, and a test power supply pin are formed on the fourth insulating layer; the first power supply line is electrically connected with the first bonding power supply pin, the second power supply line is electrically connected with the second bonding power supply pin, and the test power supply pin is electrically connected with at least one of the first power supply line and the second power supply line.

In an exemplary embodiment, the test power supply pin includes a first test power supply pin and a second test power supply pin, wherein the first test power supply pin is electrically connected with the first power supply line, and the second test power supply pin is electrically connected with the second power supply line.

In an exemplary embodiment, the preparation method further includes: a first connecting line is formed on the second insulating layer or the third insulating layer, wherein the first connecting line is disposed on a same layer as the first gate metal layer or the second gate metal layer; a first test power lead and a second test power lead are formed on the fourth insulating layer, wherein the first test power lead and the second test power lead are disposed on a same layer as the first source-drain metal layer, the first test power lead is electrically connected with the first connecting line and the first test power supply pin, the first test power supply pin is electrically connected with the first bonding power lead through the first connecting line, and the second test power lead is electrically connected with the second bonding power lead and the second test power supply pin.

The present disclosure further provides a display apparatus including the display substrate in the aforementioned embodiments. The display apparatus may be any product or component with a display function, such as a mobile phone, a tablet computer, a television, a display, a laptop computer, a digital photo frame, a navigator, etc.

The drawings in the present disclosure only refer to the structures involved in the present disclosure, and common designs may be referred to for other structures. The embodiments of the present disclosure, i.e., features in the embodiments may be combined with each other to obtain new embodiments if there is conflict.

Those of ordinary skills in the art should understand that modifications or equivalent substitutions may be made to the technical solutions of the present disclosure without departing from the spirit and scope of the technical solutions of the present disclosure, all of which should be included within the scope of the claims of the present disclosure.

What is claimed is:

1. A display substrate, comprising:
   a display region, and a peripheral region surrounding the display region, wherein the peripheral region comprises a circuit board pin region and a test pin region located on at least one side of the display region; and the display substrate comprises:
   a plurality of sub-pixels located in the display region;
   a first power supply line, located in the display region, and electrically connected with the plurality of sub-pixels;

at least one first bonding power supply pin, located in the circuit board pin region, electrically connected with the first power supply line, and configured to transmit a first power supply signal to the plurality of sub-pixels in a display stage;

a second power supply line, located in the peripheral region and surrounding the display region;

at least one second bonding power supply pin, located in the circuit board pin region, electrically connected with the second power supply line, and configured to transmit a second power supply signal to the plurality of sub-pixels in the display stage; and at least one test power supply pin, located in the test pin region, and electrically connected to at least one of the first power supply line and the second power supply line, the at least one test power supply pin being configured to transmit at least one of the first power supply signal and the second power supply signal to the plurality of sub-pixels in a test stage, wherein the at least one test power supply pin comprises a first test power supply pin and a second test power supply pin, wherein the first test power supply pin is electrically connected with the first power supply line, and the second test power supply pin is electrically connected with the second power supply line, wherein the display substrate further comprises a first connecting line, a second connecting line, a first test power lead and a second test power lead, wherein the first test power lead extends along a first direction, the second test power lead extends along the first direction, the first connecting line extends along a second direction, the second connecting line extends along the second direction, and the first direction intersects with the second direction, wherein the first test power lead is electrically connected with the first connecting line and the first test power supply pin, and the second test power lead is electrically connected with the second connecting line and the second test power supply pin, wherein the first test power supply pin and the second test power supply pin are disposed independently and do not share the at least one first bonding power supply pin and the at least one second bonding power supply pin in the circuit board pin region, wherein the first test power supply pin comprises a first sub-layer and a second sub-layer, wherein the first sub-layer is electrically connected with the second sub-layer, the first sub-layer is disposed on a same layer as a first gate metal layer, and the second sub-layer is disposed on a same layer as a first source-drain metal layer, wherein the second test power supply pin comprises a third sub-layer and a fourth sub-layer, wherein the third sub-layer and the fourth sub-layer are electrically connected, the third sub-layer is disposed on a same layer as the first gate metal layer, and the fourth sub-layer is disposed on a same layer as the first source-drain metal layer, wherein the first bonding power supply pin comprises a seventh sub-layer and an eighth sub-layer, wherein the seventh sub-layer and the eighth sub-layer are electrically connected, the seventh sub-layer is disposed on a same layer as the first gate metal layer, and the eighth sub-layer is disposed on a same layer as the first source-drain metal layer, and wherein the second bonding power supply pin comprises a fifth sub-layer and a sixth sub-layer, wherein the fifth sub-layer may be electrically connected with the sixth sub-layer, the fifth sub-layer is disposed on a same layer as the first gate metal layer, and the sixth sub-layer is disposed on a same layer as the first source-drain metal layer.

2. The display substrate of claim 1, wherein the second test power supply pin is located on one side of the first test power supply pin close to the display region.

3. The display substrate of claim 1, wherein the display substrate further comprises a first bonding power lead and a second bonding power lead, wherein the first bonding power lead is electrically connected with the first power supply line and the at least one first bonding power supply pin, and the second bonding power lead is electrically connected with the second power supply line and the at least one second bonding power supply pin;

wherein the first test power supply pin is electrically connected with the first bonding power lead through the first connecting line, and the second test power supply pin is electrically connected with the second bonding power lead through the second connecting line.

4. The display substrate of claim 3, wherein in a direction perpendicular to the display substrate, the display substrate comprises a substrate, and a first insulating layer, an active layer, a second insulating layer, the first gate metal layer, a third insulating layer, a second gate metal layer, a fourth insulating layer, and the first source-drain metal layer which are stacked on the substrate;

at least part of the first connecting line is disposed on a same layer as at least one of the first gate metal layer, the second gate metal layer, or the first source-drain metal layer.

5. The display substrate of claim 4, wherein the first connecting line comprises a first sub-connecting line and a second sub-connecting line, wherein the first sub-connecting line is disposed in a same layer as the first gate metal layer, and the second sub-connecting line is disposed in a same layer as the second gate metal layer, and the sub-connecting line and the second sub-connecting line are connected in parallel and electrically, the first sub-connecting line is at least partially overlapped with the first bonding power lead and the second bonding power lead, and the second sub-connecting line is at least partially overlapped with the first bonding power lead and the second bonding power lead; or, the first connecting line comprises a first sub-connecting line and a third sub-connecting line, the first sub-connecting line is electrically connected with the third sub-connecting line, and the first sub-connecting line is at least partially overlapped with the first bonding power lead and the second bonding power lead, the third sub-connecting line is not overlapped with the first bonding power lead or the second bonding power lead, the first sub-connecting line is disposed on a same layer as the first gate metal layer, and the third sub-connecting line is disposed on a same layer as the first source-drain metal layer.

6. The display substrate of claim 4, wherein the substrate is a rigid substrate or a flexible substrate.

7. The display substrate of claim 1, wherein in a direction perpendicular to the display substrate, the display substrate comprises a substrate, and a first insulating layer, an active layer, a second insulating layer, the first gate metal layer, a third insulating layer, a second gate metal layer, a fourth insulating layer and the first source-drain metal layer which are stacked on the substrate.

8. The display substrate of claim 1, wherein the at least one first bonding power supply pin comprises a first sub-pin and a second sub-pin, and the at least one second bonding power supply pin comprises a third sub-pin and a fourth sub-pin, wherein the third sub-pin is located on one side of the first sub-pin away from the second sub-pin, and the fourth sub-pin is located on one side of the second sub-pin away from the first sub-pin.

9. The display substrate of claim 1, wherein the test power supply pins comprise a first test power supply pin and a second test power supply pin, wherein the first test power supply pin comprises a fifth sub-pin and a sixth sub-pin, the second test power supply pin comprises a seventh sub-pin and an eighth sub-pin, the seventh sub-pin is located on one side of the fifth sub-pin away from the circuit board pin region, and the eighth sub-pin is located on one side of the sixth sub-pin away from the circuit board pin region.

10. The display substrate of claim 9, wherein the test pin region further comprises at least one first test pin and at least one second test pin, wherein the first test pin is located on one side of the seventh sub-pin away from the circuit board pin region, and the second test pin is located on one side of the eighth sub-pin away from the circuit board pin region.

11. The display substrate of claim 1, wherein the display substrate further comprises a first power bus, wherein the first power bus is located on one side of the display region close to the circuit board pin region, and the first power bus electrically connects the at least one first bonding power supply pin and the first power supply line.

12. The display substrate of claim 1, wherein the display substrate further comprises a plurality of test units, at least one test data signal line, and at least one test control signal line, wherein at least one of the plurality of test units is electrically connected with at least one of a plurality of data lines, the at least one test data signal line, and the at least one test control signal line, and is configured to deliver a signal transmitted by the at least one test data signal line to at least one data line according to a signal transmitted by the at least one test control signal line.

13. A display apparatus, comprising the display substrate of claim 1.

14. A method for preparing a display substrate, the display substrate comprising a display region and a peripheral region surrounding the display region, wherein the peripheral region comprises a circuit board pin region and a test pin region located on one side of the display region, the display region comprises a first power supply line and a plurality of sub-pixels, the peripheral region comprises a second power supply line, the circuit board pin region comprises at least one first bonding power supply pin and at least one second bonding power supply pin, and the test pin region comprises at least one test power supply pin, the method comprising:

sequentially forming a first insulating layer, an active layer, a second insulating layer, a first gate metal layer, a third insulating layer, and a second gate metal layer on a substrate;

forming a fourth insulating layer on the second gate metal layer; and forming a first source-drain metal layer, the first power supply line, the second power supply line, the at least one first bonding power supply pin, the at least one second bonding power supply pin, and at least one of the test power supply pin on the fourth insulating layer; the first power supply line is electrically connected with the at least one first bonding power supply pin, the second power supply line is electrically connected with the at least one second bonding power supply pin, and the at least one test power supply pin is electrically connected with at least one of the first power supply line and the second power supply line, wherein the at least one test power supply pin comprises a first test power supply pin and a second test power supply pin, wherein the first test power supply pin is electrically connected with the first power supply line, and the second test power supply pin is electrically connected with the second power supply line, wherein the display substrate further comprises a first connecting line, a second connecting line, a first test power lead and a second test power lead, wherein the first test power lead extends along a first direction, the second test power lead extends along the first direction, the first connecting line extends along a second direction, the second connecting line extends along the second direction, and the first direction intersects with the second direction, wherein the first test power lead is electrically connected with the first connecting line and the first test power supply pin, and the second test power lead is electrically connected with the second connecting line and the second test power supply pin, wherein the first test power supply pin and the second test power supply pin are disposed independently and do not share the at least one first bonding power supply pin and the at least one second bonding power supply pin in the circuit board pin region, wherein the first test power supply pin comprises a first sub-layer and a second sub-layer, wherein the first sub-layer is electrically connected with the second sub-layer, the first sub-layer is disposed on a same layer as the first gate metal layer, and the second sub-layer is disposed on a same layer as the first source-drain metal layer, wherein the second test power supply pin comprises a third sub-layer and a fourth sub-layer, wherein the third sub-layer and the fourth sub-layer are electrically connected, the third sub-layer is disposed on a same layer as the first gate metal layer, and the fourth sub-layer is disposed on a same layer as the first source-drain metal layer, wherein the first bonding power supply pin comprises a seventh sub-layer and an eighth sub-layer, wherein the seventh sub-layer and the eighth sub-layer are electrically connected, the seventh sub-layer is disposed on a same layer as the first gate metal layer, and the eighth sub-layer is disposed on a same layer as the first source-drain metal layer, and wherein the second bonding power supply pin comprises a fifth sub-layer and a sixth sub-layer, wherein the fifth sub-layer may be electrically connected with the sixth sub-layer, the fifth sub-layer is disposed on a same layer as the first gate metal layer, and the sixth sub-layer is disposed on a same layer as the first source-drain metal layer.

15. The preparing method of claim 14, wherein the method further comprises:

forming the first connecting line on the second insulating layer or the third insulating layer, wherein the first connecting line is disposed on a same layer as the first gate metal layer or the second gate metal layer;

forming the first test power lead and the second test power lead on the fourth insulating layer, wherein the first test power lead and the second test power lead are disposed on a same layer as the first source-drain metal layer, the first test power supply pin is electrically connected with a first bonding power lead through the first connecting line, and the second test power lead is electrically connected with a second bonding power lead.

* * * * *